(12) United States Patent
Achi et al.

(10) Patent No.: US 12,284,852 B2
(45) Date of Patent: Apr. 22, 2025

(54) LIGHT EMITTING MODULE

(71) Applicant: NICHIA CORPORATION, Anan (JP)

(72) Inventors: Yusaku Achi, Tokushima (JP); Ryohei Yamashita, Tokushima (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 17/804,906

(22) Filed: Jun. 1, 2022

(65) Prior Publication Data

US 2022/0293833 A1    Sep. 15, 2022

Related U.S. Application Data

(63) Continuation of application No. 16/698,323, filed on Nov. 27, 2019, now Pat. No. 11,380,826.

(30) Foreign Application Priority Data

Nov. 30, 2018  (JP) .................................. 2018-225897

(51) Int. Cl.
*H10H 20/855* (2025.01)
*F21V 8/00* (2006.01)
(Continued)

(52) U.S. Cl.
CPC ......... *H10H 20/855* (2025.01); *G02B 6/0073* (2013.01); *G02F 1/133603* (2013.01); *H10H 20/8514* (2025.01)

(58) Field of Classification Search
CPC . H01L 33/505; H01L 33/58; G02F 1/133603; G02B 6/0073; H10H 20/855; H10H 20/8514
See application file for complete search history.

(56) References Cited

U.S. PATENT DOCUMENTS 6,193,383 B1 * 2/2001 Onikiri ................ G02B 6/0018
362/23.15
6,345,903 B1 * 2/2002 Koike ................ H10H 20/8506
257/E33.059

(Continued)

FOREIGN PATENT DOCUMENTS

JP        H1082915 A      3/1998
JP     2007329114 A     12/2007
(Continued)

OTHER PUBLICATIONS

Non-Final Office Action, United States Patent and Trademark Office, issued to U.S. Appl. No. 16/698,323 on Dec. 24, 2020, 11 pages.
(Continued)

*Primary Examiner* — Evan P Dzierzynski
*Assistant Examiner* — Nathaniel J Lee
(74) *Attorney, Agent, or Firm* — Hunton Andrews Kurth LLP

(57) ABSTRACT

A light emitting module includes a light guiding plate being light-transmissive and having a first main surface being as a light exiting surface and a second main surface positioned opposite to the first main surface; a light emitting element disposed at the second main surface and configured to emit light toward the light guiding plate; an optical function part being greater in size than a light emitting surface of the light emitting element, the optical function part being disposed in the first main surface so as to correspond to an optical axis of the light emitting element; and a light-cutting scattering layer disposed on a first main surface side of the light guiding plate so as to correspond to the optical axis of the light emitting element. The light-cutting scattering layer covers the optical function part as seen in a plan view.

13 Claims, 27 Drawing Sheets

(51) Int. Cl.
*G02F 1/13357* (2006.01)
*H10H 20/851* (2025.01)

(56) References Cited

U.S. PATENT DOCUMENTS

| | | | |
|---|---|---|---|
| 7,413,318 B2 | 8/2008 | Hsu et al. | |
| 2007/0103889 A1* | 5/2007 | Hsu | G02F 1/133608 362/217.11 |
| 2008/0186273 A1 | 8/2008 | Krijn et al. | |
| 2009/0296367 A1* | 12/2009 | Sekine | H10H 20/856 362/346 |
| 2010/0220484 A1* | 9/2010 | Shani | G02B 6/0025 362/296.09 |
| 2011/0051412 A1* | 3/2011 | Jeong | G02F 1/133611 362/235 |
| 2012/0069575 A1* | 3/2012 | Koh | G02B 6/0046 362/257 |
| 2012/0069579 A1 | 3/2012 | Koh et al. | |
| 2012/0224111 A1 | 9/2012 | Ohshima | |
| 2015/0124484 A1 | 5/2015 | Gu et al. | |
| 2017/0131458 A1 | 5/2017 | Yamada | |
| 2018/0212128 A1* | 7/2018 | Hayashi | H10H 20/8583 |
| 2018/0239193 A1* | 8/2018 | Hayashi | G02F 1/133606 |
| 2018/0335559 A1 | 11/2018 | Cho | |
| 2019/0227382 A1 | 7/2019 | Watanabe et al. | |
| 2020/0049877 A1 | 2/2020 | Watanabe et al. | |
| 2020/0176650 A1 | 6/2020 | Achi et al. | |

FOREIGN PATENT DOCUMENTS

| | | |
|---|---|---|
| JP | 2008059786 A | 3/2008 |
| JP | 2009506492 A | 2/2009 |
| JP | 2009289701 A | 12/2009 |
| JP | 2011039122 A | 2/2011 |
| JP | 2011224253 A | 11/2011 |
| JP | 2012182023 A | 9/2012 |
| JP | 2012204337 A | 10/2012 |
| JP | 2014220207 A | 11/2014 |
| JP | 2017092017 A | 5/2017 |
| JP | 2018101521 A | 6/2018 |
| JP | 2018106826 A | 7/2018 |
| JP | 2018133304 A | 8/2018 |
| TW | 201215936 A | 4/2012 |

OTHER PUBLICATIONS

Final Office Action, United States Patent and Trademark Office, issued to U.S. Appl. No. 16/698,323 on Jun. 21, 2021, 13 pages.
Notice of Allowance, United States Patent and Trademark Office, issued to U.S. Appl. No. 16/698,323 on Mar. 1, 2022, 9 pages.

* cited by examiner

LIGHT EMITTING MODULE

CROSS-REFERENCE TO RELATED APPLICATION

This is a continuation application of U.S. patent application Ser. No. 16/698,323, filed Nov. 27, 2019, which claims priority under 35 U. S. C. § 119 to Japanese Patent Application No. 2018-225897, filed on Nov. 30, 2018, the disclosures of which all are hereby incorporated by reference in their entirety.

BACKGROUND

The present disclosure relates to a planar light emitting module including a light guiding plate having a plurality of light emitting elements disposed on its one surface.

A light emitting module including a light guiding plate provided with a plurality of light emitting elements such as light emitting diodes disposed on its one surface is widely used as various kinds of light sources including backlight of a liquid crystal display and light sources for other displays. For example, Japanese Patent Publication No. 1998-82915 discloses a light emitting device including a light guiding plate provided with a plurality of light emitting elements disposed on its one surface.

A light emitting module including a light guiding plate provided with a plurality of light emitting elements which are disposed on one surface at a predetermined interval is desired to have less luminance non-uniformity and reduced thickness. An object of the present disclosure is to provide a light emitting module with less luminance non-uniformity and reduced thickness.

SUMMARY

A light emitting module of the present disclosure includes: a light guide plate, a light emitting element, an optical function part and a light-cutting scattering layer.

The light guiding plate is light-transmissive, and has a first main surface being as a light exiting surface from which light exit to outside, and a second main surface positioned opposite to the first main surface. The light emitting element is disposed at the second main surface of the light guiding plate, and is configured to emit light toward the light guiding. The optical function part is greater in size than a light emitting surface of the light emitting element, and is disposed in the first main surface of the light guiding plate so as to correspond to an optical axis of the light emitting element. The light-cutting scattering layer is disposed on a first main surface side of the light guiding plate so as to correspond to the optical axis of the light emitting element. The light-cutting scattering layer covers the optical function part as seen in a plan view.

The present disclosure may provide a light emitting module with less luminance non-uniformity and reduced thickness.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, in which.

DETAILED DESCRIPTION OF EMBODIMENTS

Figure 1:
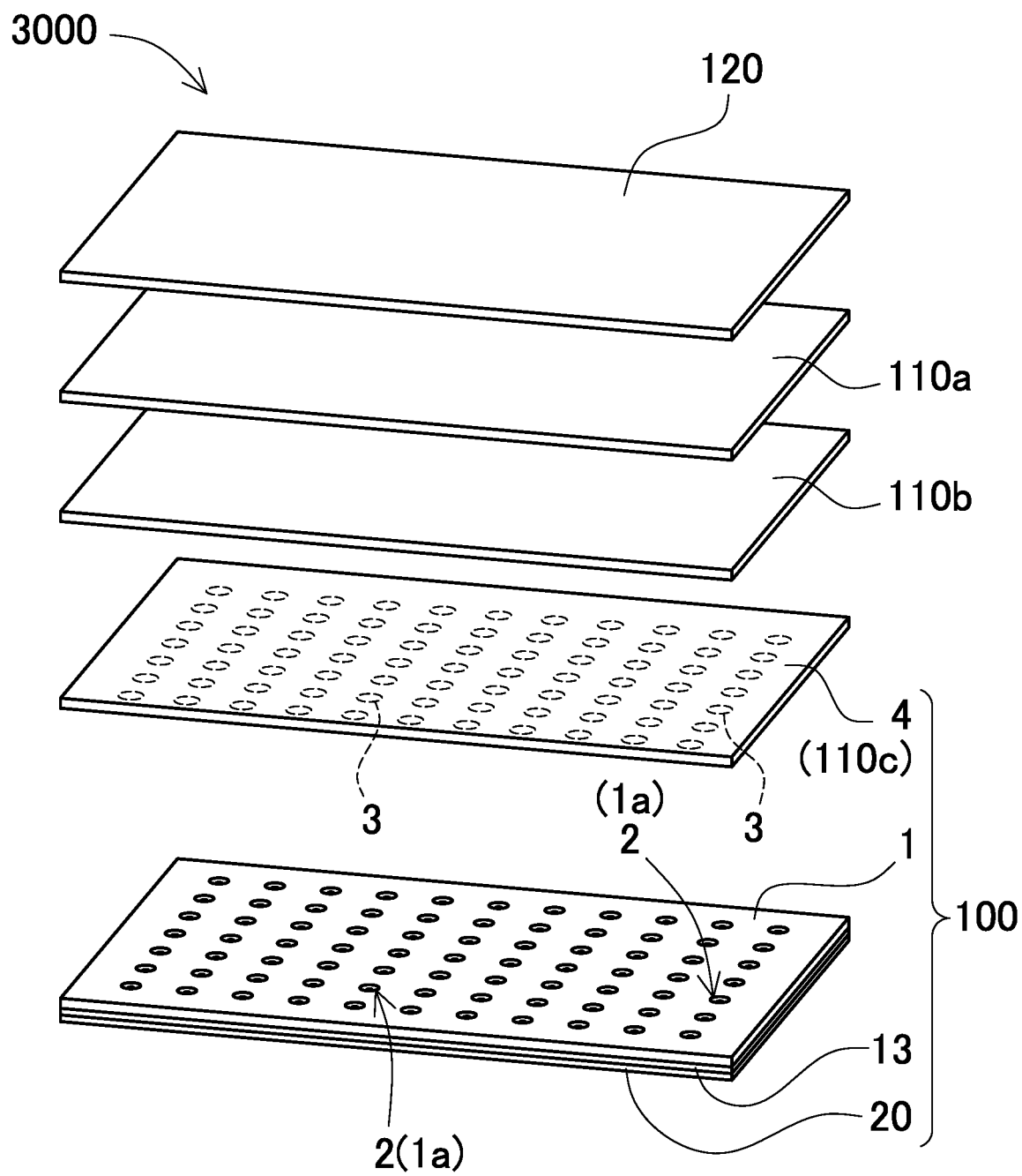
FIG. 1 is a configuration diagram showing the constituent members of a liquid crystal display device according to certain embodiments of the present disclosure.

Embodiments will now be described with reference to the accompanying drawings, wherein like reference numerals designate corresponding or identical elements throughout the various drawings.

In the following, a detailed description will be given of the present disclosure with reference to the drawings. In the following description, while the terms meaning a specific direction or position (e.g., "upper", "lower", and other terms including those terms) are used as necessary, these terms are for facilitating understanding of the present disclosure with reference to the drawings, and the technical scope of the present disclosure is not limited by the meaning of such terms. Portions with the same reference numerals in a plurality of drawings represent the same or equivalent portion or member.

The embodiments described below are of an exemplary nature for illustrating a light emitting module for embodying the technical idea of the present disclosure, and not intended to limit the present disclosure to the embodiments. The dimension, material, shape, relative disposition or the like of the constituent components described in the following are of an exemplary nature and not intended to limit the scope of the present disclosure thereto unless otherwise specified. The contents described in certain embodiment or example is applicable also to other embodiment or example. The size, positional relationship and the like of the members shown in the drawings may be exaggerated for the sake of clarity.

Liquid Crystal Display Device 3000

FIG. 1 is a configuration diagram showing the constituent members of a liquid crystal display device 3000 according to embodiments. The liquid crystal display device 3000 shown in FIG. 1 includes a liquid crystal panel 120, two lens sheets 110*a*, 110*b*, a diffusing sheet 110*c*, and a light emitting module 100, sequentially from the upper side. The liquid crystal display device 3000 according to the present embodiment is a so-called direct backlight-type liquid crystal display device in which the light emitting module 100 is disposed under the liquid crystal panel 120. The liquid crystal display device 3000 irradiates the liquid crystal panel 120 with light emitted by the light emitting module 100. The liquid crystal display device 3000 may further include a polarizing film, a color filter, a DBEF and the like.

Embodiment 1

Light Emitting Module 100

Figure 2A:
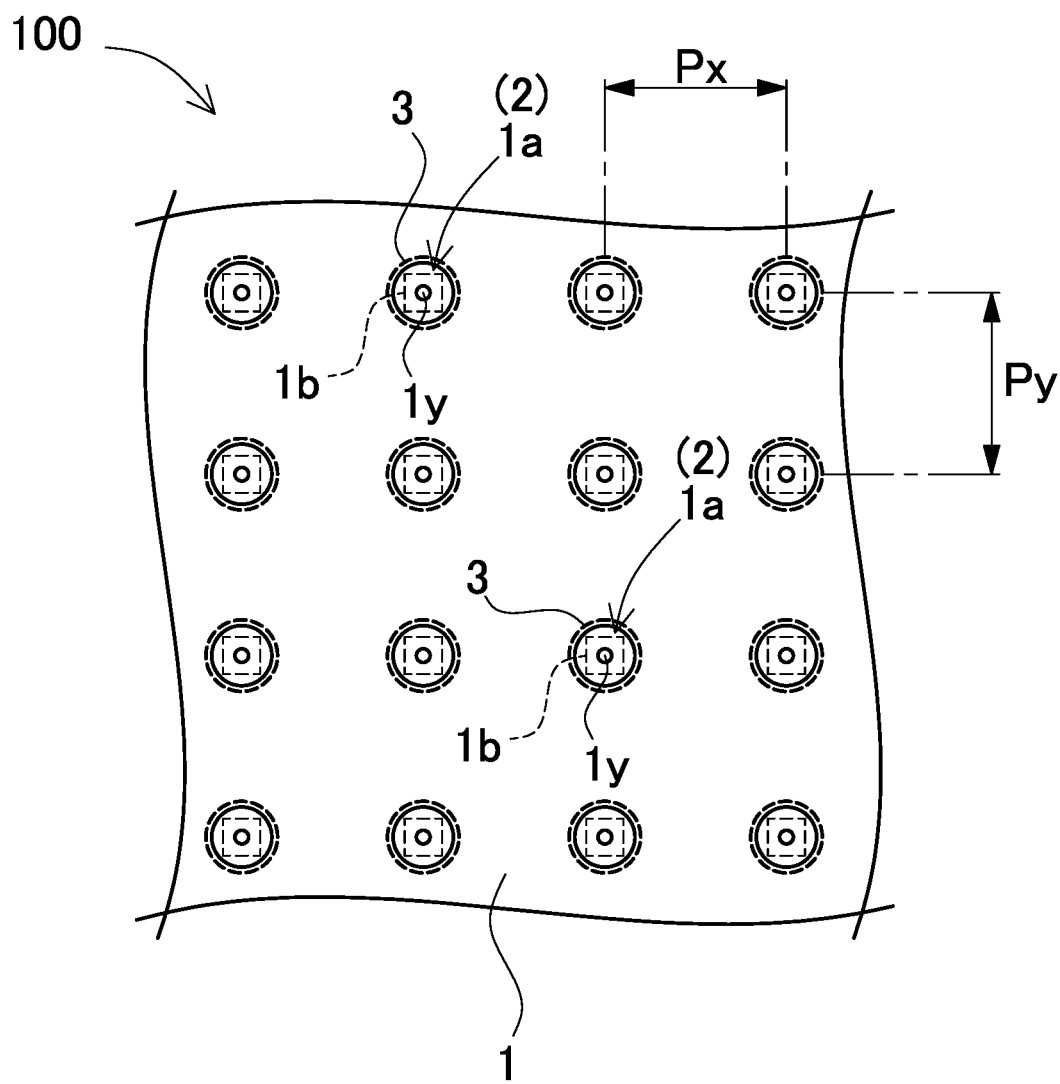
FIG. 2A is a schematic plan view of a light emitting module according to Embodiment 1 of the present disclosure.
Figure 2B:
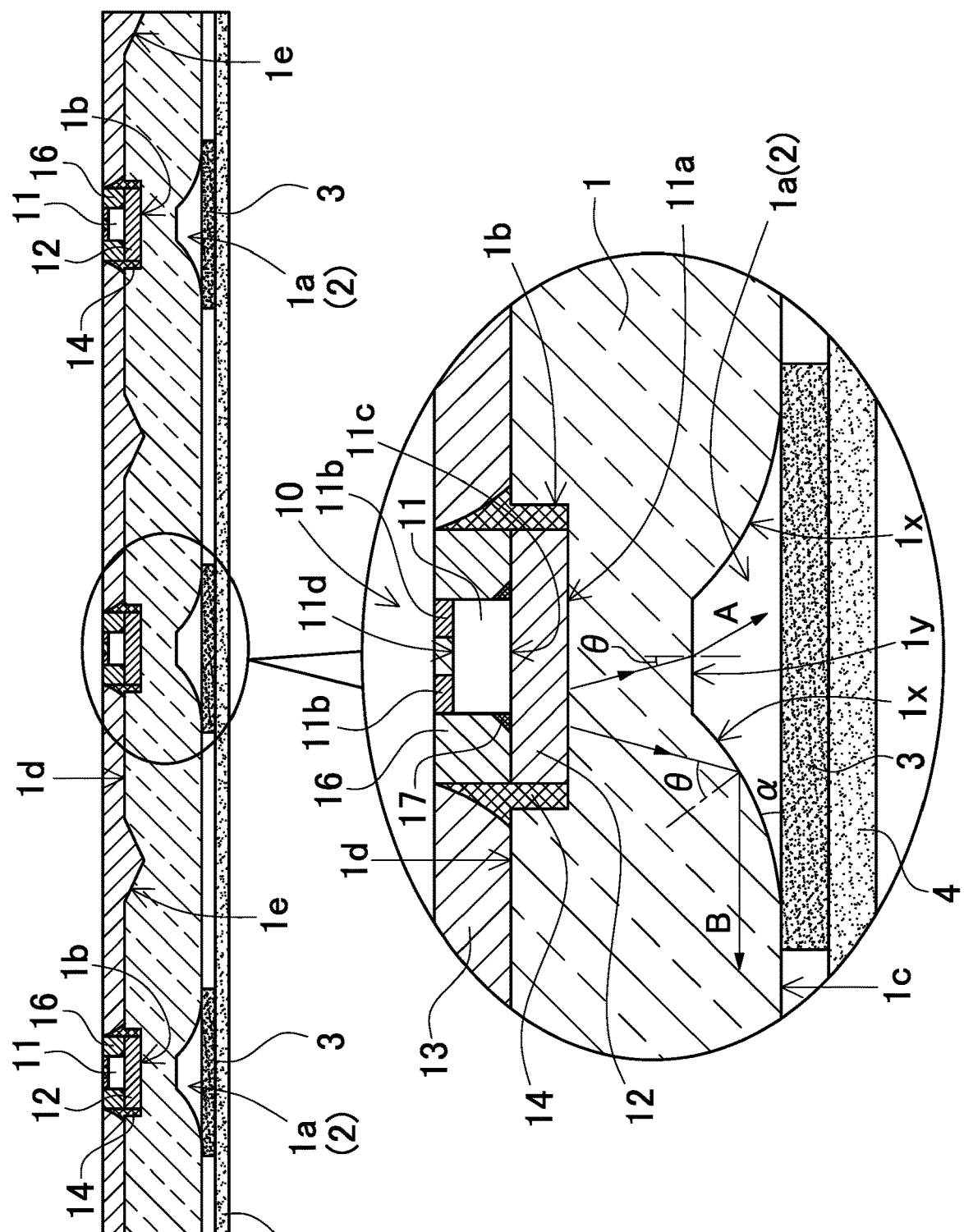
FIG. 2B is a partial enlarged schematic cross-sectional view of the light emitting module according to Embodiment 1 of the present disclosure.
Figure 2C:
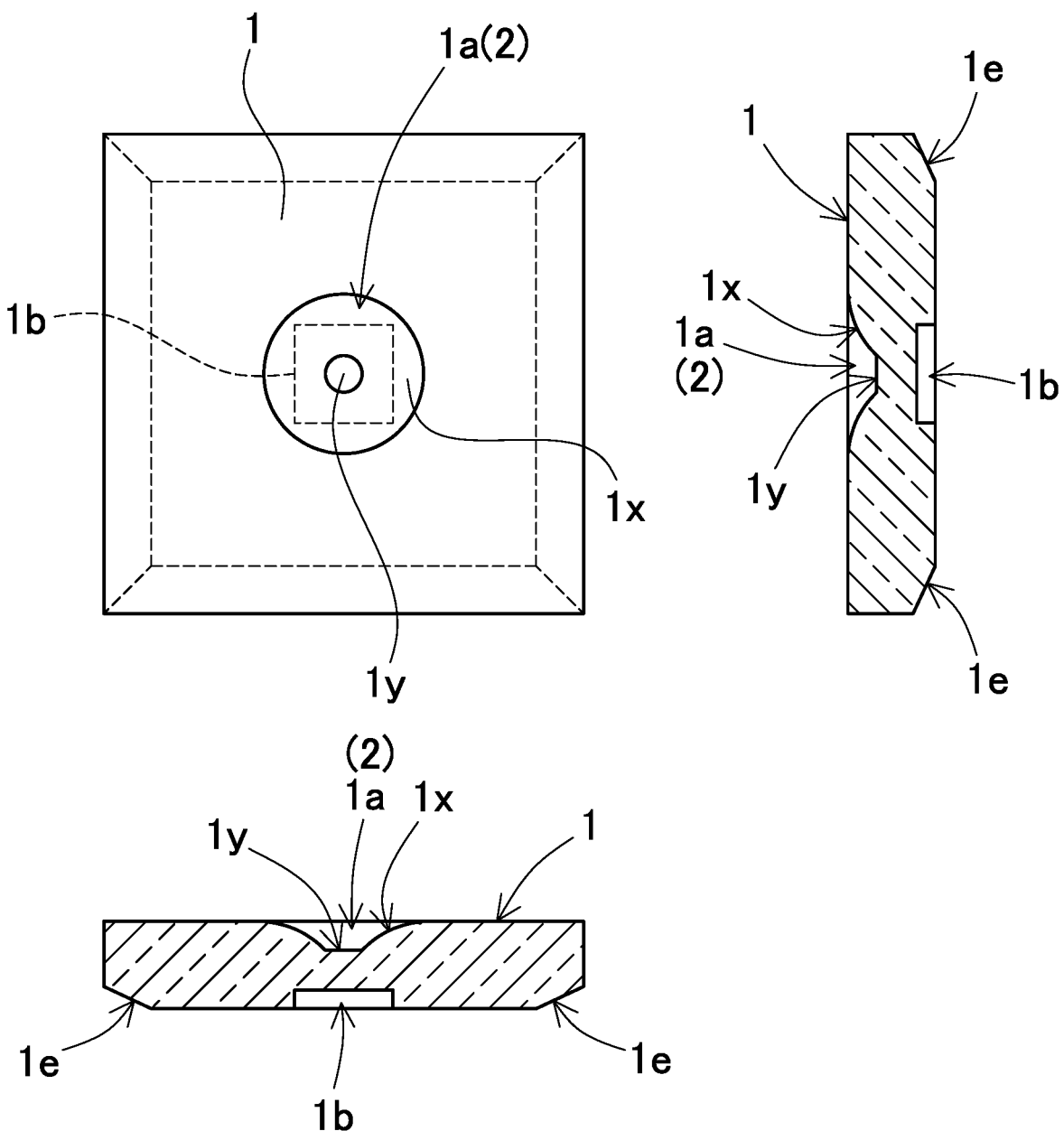
FIG. 2C is an enlarged schematic plan view and an enlarged schematic cross-sectional view of an exemplary light guiding plate.

FIGS. 2A to 2C show the configuration of a light emitting module according to the present embodiment. FIG. 2A is a schematic plan view of the light emitting module 100 according to the present embodiment. FIG. 2B is a partial enlarged schematic cross-sectional view of the light emitting module 100 according to the present embodiment. FIG. 2C is an enlarged partial schematic plan view and a partial enlarged schematic cross-sectional view showing an exemplary optical function part 2 of a light guiding plate 1 according to the embodiment and a recess 1$b$ for providing a wavelength conversion part at a light guiding plate 1.

The light emitting module 100 includes a light guiding plate 1, a plurality of light emitting elements 11 disposed at the light guiding plate 1, and a light-cutting scattering layer 3 layered on a surface of the light guiding plate 1. The light emitting elements 11 are arranged in a matrix on the light guiding plate 1. The light guiding plate 1 of the light emitting module 100 includes a first main surface 1$c$ that is a light emitting surface emitting from which light exits to the outside, and a second main surface 1$d$ opposite to the first main surface 1$c$. The light guiding plate 1 may include a plurality of partitioning recesses 1$e$ at the second main surface 1$d$. Between adjacent partitioning recesses 1$e$, a wavelength conversion part 12 is disposed. The wavelength conversion parts 12 are respectively provided in recesses 1$b$ provided on the light guiding plate 1, and between the light emitting elements 11 and the light guiding plate 1. The wavelength conversion parts 12 convert the wavelength of light emitted by the light emitting elements 11 before the light becomes incident on the light guiding plate 1. On each of the wavelength conversion parts 12, one light emitting element 11 is disposed.

The light emitting module 100 shown in FIG. 2B includes, as shown in FIG. 3, light emitting element units 10 each including: the light emitting element 11; the wavelength conversion part 12 covering a main light emitting surface 11$c$ of the light emitting element 11; and a light-reflective member 16 covering the lateral surface of the light emitting element 11. As the manner shown in FIG. 4B, the light emitting element units 10 are respectively bonded to the recesses 1$b$ of the light guiding plate 1, so that the wavelength conversion parts 12 and the light emitting elements 11 are disposed at predetermined positions in the light guiding plate 1. Thus, the light emitting module 100 has a structure in which light emitted by the light emitting elements 11 becomes incident on the light guiding plate 1 via the wavelength conversion parts 12. In the light emitting module, the wavelength conversion parts and the light emitting elements are not necessarily a part of the light emitting element units to be disposed at the light guiding plate. Alternatively, a wavelength conversion material may be provided in the recesses formed at the light guiding plate to form wavelength conversion parts, and the light emitting elements may be bonded to the wavelength conversion parts, so that the wavelength conversion parts and the light emitting elements are disposed at predetermined positions in the light guiding plate.

In the light emitting module 100 shown in FIG. 2B, the optical function parts 2 are disposed on the first main surface 1$c$ side of the light guiding plate 1, and the light-cutting scattering layers 3 are disposed so as to respectively cover the optical function parts 2 as seen in a plan view. The optical function parts 2 are respectively disposed on the optical axes of the light emitting elements 11. On the optical axes, the light-cutting scattering layers 3 are also disposed. Thus, light emitted by the light emitting elements 11 exits to the outside via respective optical function parts 2 and light-cutting scattering layers 3.

Light emitted by the light emitting elements 11 becomes incident on the light guiding plate 1 via the wavelength conversion parts 12. In the light emitting module 100, light emitted by the light emitting elements 11 becomes incident on the light guiding plate 1 via respective wavelength conversion parts 12. In the present specification, "the light emitting surface of the light emitting element" refers to the surface at which light of the light emitting element becomes incident on the light guiding plate. Therefore, in the light emitting module in which light emitted by the light emitting elements becomes incident on the light guiding plate via the wavelength conversion parts, the light emitting surface of the light emitting element is the surface of the wavelength conversion part (i.e., the surface of the light emitting element unit). In the light emitting module, light emitted by each light emitting element is not limited to light becoming incident on the light guiding plate via the corresponding wavelength conversion part. For example, in the light emitting module, light emitted by the light emitting element may become incident on the light guiding plate via a light adjusting layer. In a light emitting module in which light emitted by the light emitting element become incident on the light guiding plate via the light adjusting layer, the light emitting surface of the light emitting element is the surface of the light adjusting layer. The light adjusting layer may be any layer configured to control light from the light emitting element before the light become incident on the light guiding plate, for example, a layer that scatters light from the light emitting element before the light become incident on the light guiding plate. In this case, a light emitting element unit in which a light adjusting layer is included instead of the wavelength conversion part may be formed. Having this light emitting element unit disposed at the light guiding plate, light from the light emitting element may become incident on the light guiding plate via the light adjusting layer.

In the light emitting module of the present disclosure, the light emitting elements 11 are disposed on the second main surface 1$d$ of the light guiding plate 1. On the first main surface 1$c$, the optical function parts 2 are disposed, and the light-cutting scattering layers 3 are layered so as to respectively cover the optical function parts 2. The light emitting module 100 structured in this manner may have a reduced thickness with less luminance non-uniformity. In the light emitting module 100 in which the optical function parts 2 and the light-cutting scattering layers 3 are layered on the optical axes of the light emitting elements 11, light becoming incident on the light guiding plate 1 from light emitting surfaces 11$a$ of the light emitting elements 11 is diffused by the optical function parts 2 to travel from the optical axes to outward. Furthermore, in the light emitting module 100, the light on the optical axes having transmitted through the light guiding plate 1 and the optical function parts 2 is cut with the light-cutting scattering layers 3, that is, a portion of light having high intensity on the optical axes of the light emitting elements 11 is cut and diffused outward. This may achieve the benefit that the light emitting module 100 has a reduced thickness as a whole with less luminance non-uniformity. By virtue of the light-cutting scattering layers 3 being disposed so as to respectively cover the optical function parts 2 disposed on the optical axes of the light emitting elements 11, light having transmitted through the optical function parts 2 is cut and diffused by the light-cutting scattering layer 3. This further contributes to have less luminance non-uniformity. The light-cutting scattering layers 3 may reduce luminance non-uniformity attributed to misalignment between the optical function parts 2 and the light emitting elements 11. Thus, the light emitting module 100 with less luminance non-uniformity while being reduced thickness is effectively mass-produced.

In a direct backlight-type liquid crystal display device, attributed to the short distance between the liquid crystal panel and the light emitting module, the luminance non-uniformity of the light emitting module may influence the luminance non-uniformity of the liquid crystal display device. Accordingly, there exist demands for a light emitting module with less luminance non-uniformity used for a direct backlight-type liquid crystal display device.

The structure of the light emitting module 100 according to the present embodiment may have a reduced thickness of, for example, 5 mm or less, 3 mm or less, or 1 mm or less.

In the following, a detailed description will be given of the members structuring the light emitting module 100 and a method of manufacturing the same according to the present embodiment.

Light Guiding Plate 1

The light guiding plate 1 is a light-transmissive member that receives light from the light emitting elements 11 and enable surface light emission.

The light guiding plate 1 according to the present embodiment includes a first main surface 1c being the light emitting surface, and a second main surface 1d opposite to the first main surface 1c.

On the second main surface 1d of the light guiding plate 1, a plurality of light emitting elements 11 is disposed. In the light guiding plate 1 shown in FIG. 2B, the light emitting element units 10 are respectively disposed in the recesses 1b provided at the second main surface 1d. This structure may reduce the distance between the light guiding plate 1 and the light emitting elements 11 and, consequently, reduces the thickness of the light emitting module 100.

The length of each side of the light guiding plate 1 in a top view may be in a range of, for example, about 1 cm to 200 cm, preferably about 3 cm to 30 cm. The thickness of the light guiding plate 1 may be in a range of about 0.1 mm to 5 mm, preferably about 0.5 mm to 3 mm.

The top-view shape of the light guiding plate 1 may be, for example, substantially quadrangular or substantially circular.

The material of the light guiding plate 1 may be an optically transparent material, for example, glass or a resin material such as thermoplastic resin including acrylic, polycarbonate, cyclic polyolefin, polyethylene terephthalate, polyester and the like, or thermosetting resin including epoxy, silicone and the like. In particular, a thermoplastic resin material is preferable for its efficient manufacturability by injection molding. Among others, polycarbonate is preferably for its high transparency and inexpensiveness. The method of manufacturing the light emitting module in which the light emitting elements 11 are mounted on the light guiding plate 1 and thereafter the wiring board is bonded thereto may dispense with the a high-temperature operation such as reflow soldering. Therefore, a material that is thermoplastic and withstands little heat, such as polycarbonate, may be used.

The light guiding plate 1 may be molded by, for example, injection molding, transfer molding, or thermal transfer. When the light guiding plate 1 includes the optical function part 2, the recesses 1b, and the partitioning recesses 1e which will be described later, preferably such elements are collectively molded with a mold assembly. This may reduce misalignment in molding of the optical function parts 2 and the recesses 1b and the partitioning recesses 1e.

The light guiding plate 1 according to the present embodiment may be formed as a single layer, or may be a plurality of light-transmissive layers being layered on one another. When the light guiding plate 1 is configured as a light-transmissive multi-layers, preferably a layer differing in refractive index, for example, an air layer, is provided between ones of the layers. This structure further facilitates diffusion of light, and provides a light emitting module with less luminance non-uniformity. Such a structure is implemented by, for example, interposing a spacer between ones of the plurality of light-transmissive layers so as to separate them from each other, thereby providing an air layer.

Alternatively, a light-transmissive layer may be provided on the first main surface 1c of the light guiding plate 1, and a layer differing in refractive index, for example, an air layer, may be provided between the first main surface 1c of the light guiding plate 1 and the light-transmissive layer. This structure further facilitates diffusion of light, and provides a liquid crystal display device with less luminance non-uniformity. Such a structure is implemented by, for example, interposing a spacer between the light guiding plate 1 and the light-transmissive layer, thereby providing an air layer.

Optical Function Parts 2

The light guiding plate 1 includes the optical function parts 2 on the first main surface 1c side. The optical function parts 2 may have a function of, for example, spreading light being incident on the light guiding plate 1 within the plane. The optical function parts 2 are formed of, for example, a material differing in refractive index from the material of the light guiding plate 1. Specifically, as shown in FIG. 2B, each of the optical function parts 2 may be configured as a recess 1a formed on the light guiding plate 1. In FIG. 2B, each optical function part 2 has one or more inclined surface 1x on an inner surface of the recess 1a. In FIG. 2B, the inclined surface 1x is inclined upward toward the center of the recess 1a as approaching the light emitting element 11. In the optical function part 2 shown in the cross-sectional view of FIG. 2B, an inclination angle (a) of the inclined surface 1x becomes gradually greater toward the central part. The optical function parts 2 having such a shape effectively spread light being incident on the light guiding plate 1 from the light emitting surfaces 11a of the light emitting elements 11, in the planar direction of the light guiding plate 1. The optical function part 2 includes a flat part 1y at its bottom part. In each optical function part 2, the flat part 1y is positioned at the central part of the recess 1a. The optical function part 2 including the flat part 1y at the central part of the recess 1a may suppress a reduction in strength in the light guiding plate 1 adversely invited by the formation of the recess 1a. This is because the flat part 1y provided at the central part may make the minimum thickness of the light guiding plate 1 greater. The optical function part 2 is preferably disposed on the optical axis of the light emitting element 11, more preferably, having the flat part 1y positioned on the optical axis of the light emitting element 11. The optical function part 2 having the flat part 1y may reduce luminance non-uniformity attributed to misalignment between the light emitting elements 11 and the optical function parts 2, as compared to the optical function parts with no flat parts. This is because contribution of the flat part 1y being parallel to the light emitting surface 11a of the light emitting element 11 which is the light exiting surface, luminance non-uniformity attributed to misalignment between the flat part 1y and the light exiting surface is reduced. While not shown in the drawings, the optical function part may be a depression provided on the first main surface side having a shape such as an inverted cone or inverted polygonal pyramid including an inverted quadrangular pyramid, an inverted hexagonal pyramid or the like, with or without the flat part at its bottom part.

The optical function part 2 may allow light from the light emitting element 11 being incident at the interface between the material having refractive index from that of the light guiding plate 1 (i.e., air) and the inclined surface 1x of the recess 1a to travels in the lateral direction of the light emitting element 11. The recess 1a having the inclined surface 1x may be provided with, for example, a light-reflective material (i.e., a reflective film formed of metal or white-color resin). The inclined surface 1x of each optical function part 2 may be curved or straight as seen in a cross-sectional view. In FIGS. 2B and 2C, the inclined surface 1x of optical function part 2 as seen in a cross-sectional view is curved such that inclination angle (a) becomes gradually greater toward the center of the recess 1a. The inclined surface 1x as seen in a cross-sectional view may be formed of straight lines with different inclination angles (a) which become gradually greater toward the center.

As will be described later, the optical function parts 2 are disposed so as to respectively correspond to the light emitting elements 11, that is, disposed at the positions on the side opposite to the light emitting elements 11 disposed on the second main surface 1d side.

The size of the optical function part 2 may appropriately be set. In the optical function part 2 shown in FIG. 2B, the outline of the circular opening as seen in a top view is greater than the outline of the wavelength conversion part 12, which is the light emitting surface 11a of the light emitting element 11. The optical function parts 2 may allow light from the light emitting surface 11a of the corresponding light emitting element 11 inside the light guiding plate 1 to become incident on the light guiding plate 1, so that light may effectively spread the light in the planar direction of the light guiding plate 1. In the light emitting module 100 in which the light guiding plate 1 receives light emitted by the light emitting elements 11 via the wavelength conversion parts 12, the light becomes incident on the light guiding plate 1 in every direction from the wavelength conversion parts 12 toward the light guide plate 1. The light becoming incident on the light guiding plate 1 is totally reflected at the interface between the light guiding plate 1 and each optical function part 2, thereby efficiently spreading in the planar direction of the light guiding plate 1. Part of the light becoming incident on the light guiding plate 1 is totally reflected in the planar direction of the light guiding plate 1, and another part of the light is not totally reflected at the interface between the light guiding plate 1 and the optical function part 2, but transmits through each optical function part 2 and emitted to the outside from the first main surface 1c of the light guiding plate 1. In particular, at the flat part 1y positioned at the central part of each recess 1a, the incident angle of light at the interface between the optical function part 2 and the light guiding plate 1 is smaller than at the inclined surface 1x, that is, the rate of light totally reflected is reduced and the intensity of exiting light is high. The light exiting to the outside from the first main surface 1c of the light guiding plate 1 transmitting through the optical function parts 2 contributes to reducing luminance non-uniformity.

Light-Cutting Scattering Layer 3

In the light emitting module 100, the optical function parts 2 are provided at the light guiding plate 1 to laterally spread light from the light emitting elements 11, thereby leveling the light-emission intensity of light exiting to the outside from the first main surface 1c of the light guiding plate 1. This structure is preferable in reducing luminance non-uniformity. Luminance non-uniformity of the light emitting module 100 may be reduced by narrowing the interval between the light emitting elements 11. On the other hand, narrowing the interval between the light emitting elements 11 increases the number of light emitting elements on the light guiding plate 1 and, therefore, increases the material costs and the manufacturing costs. There may be a room for improving the light emitting module 100 to reduce luminance non-uniformity while reducing the number of the light emitting elements 11 thereby reducing costs. There may be another room for improving luminous non-uniformity of the light emitting module 100 in which a plurality of optical function parts 2 each including the light emitting element 11 is provided on the light guiding plate 1, which is attributed to misalignment between the optical function parts 2 and the light emitting elements 11. In the light emitting module 100 including the light guiding plate 1 provided with the recesses 1a where the optical function parts 2 are formed, the light guiding plate 1 is reduced in thickness at the central part of each optical function part 2, and therefore the mechanical strength is reduced. The light emitting module 100 having a structure in which the optical function parts 2 are each provided with the flat part 1y at the central part of the recess may have improved mechanical strength at the central part of the recess. Additionally, the flat part 1y contributes to reducing luminance non-uniformity attributed to misalignment between the light guiding plate 1 and the light emitting elements 11. However, the flat part 1y of the optical function part 2 transmits a greater amount of light from the light emitting element 11 and impairs the effect of reducing luminance non-uniformity.

Accordingly, the light emitting module according to the present embodiment includes the light-cutting scattering layers 3 at the position respectively covering the optical function parts 2. The light-cutting scattering layers 3 scatter and cut light that is emitted from the light emitting elements 11 and transmitted through the optical function parts 2, while inhibiting a strength reduction of the light guiding plate 1. This structure may reduce the unfavorable effect associated with provision of the optical function parts 2 thereby reducing luminance non-uniformity. The light emitting module according to the present embodiment may provide the unique layered structure of the optical function parts 2 and the light-cutting scattering layers 3 that functions to precisely leveling light from the light emitting elements 11, to implement a high-quality backlight-purpose light source with reduced luminance non-uniformity.

The light-cutting scattering layers 3 are disposed at the first main surface 1c of the light guiding plate 1 so as to respectively cover the optical function parts 2. The light-cutting scattering layers 3 diffuse thereby cutting light transmitting through the optical function parts 2, to inhibit luminance concentration. The light-cutting scattering layers 3 are each specifically a sheet member formed of light-transmissive plastic or glass, to which a pigment or dye is added. The pigment or dye is preferably of white color, so as to enhance light reflectivity. This may reduce luminance non-uniformity while inhibiting a luminance reduction of the light emitting module 100 attributed to provision of the light-cutting scattering layers 3. The light-cutting scattering layers 3 cut light by scattering the transmitting light, but not by absorbing the transmitting light. The pigment or dye in the light-cutting scattering layers 3 may be configured as a colored pigment of red, orange, or yellow, for example. Such light-cutting scattering layers 3 may absorb part of transmitting light to control the color of light emitted by the light emitting module 100, and scatter thereby cutting the light. In particular, the light emitting module in which light emitting diodes emitting blue-color light are configured as the light emitting elements 11 may employ pigment or dye which absorbs blue color in the light-cutting scattering layers 3, so as to convert the wavelength of the blue-color light of the blue-color light emitting diode before exiting to the outside.

The light-cutting scattering layers 3 are preferably formed of resin containing a white-color pigment or the like. The light cutting capacity of the light-cutting scattering layers 3 may be adjusted by the amount of the contained pigment or dye. The light-cutting scattering layers 3 are preferably formed of silicone resin containing titanium oxide as the white-color pigment. The light transmittance of the light-cutting scattering layers 3 may be controlled by the amount of the contained white-color pigment. When the light-cutting scattering layers 3 contain a greater amount of white-color pigment in the resin, the transmittance of the light-cutting scattering layers 3 may be lower. The transmittance is the attenuation rate of light linearly transmitting through the light-cutting scattering layers 3 in the thickness direction, and is the rate obtained by "the intensity of light transmitting through the light-cutting scattering layer 3 in the thickness direction divided by the intensity of incident light". Preferably, the light-cutting scattering layers 3 contain a white-color pigment by 60 weight percent or less, to set the transmittance to an optimum value. The transmittance of the light-cutting scattering layers 3 is adjusted by controlling the content of the pigment or dye.

The light-cutting scattering layers 3 reflect, scatter thereby cutting transmitting light. The light-cutting scattering layers 3 respectively cover the optical function parts 2 as seen in a top view. The optical function parts 2 provided at the first main surface 1c of the light guiding plate 1 spread light becoming incident from the wavelength conversion parts 12 in the planar direction of the light guiding plate 1, thereby reducing luminance non-uniformity. As represented by arrow B in FIG. 2B, the optical function parts 2 each reflect light totally reflected at the boundary between the optical function part 2 and the light guiding plate 1 by 100%, and diffuse the light in the planar direction of the light guiding plate 1. The total reflection of light occurs when an incident angle (θ) is greater than the critical angle. Light of which incident angle (θ) is smaller than the critical angle is not totally reflected at the boundary between the optical function part 2 and the light guiding plate 1, and also exits to the outside. The light represented by arrow A in FIG. 2B has a small incident angle (θ), and therefore transmits through the flat part 1y of the optical function part 2. The light-cutting scattering layer 3 cuts the light otherwise transmitting through the optical function part 2 and exiting to the outside, thereby reducing luminance non-uniformity of the light emitting module 100.

In the light emitting module 100 shown in FIG. 2B, the light-cutting scattering layers 3 are disposed at predetermined positions through layering the light-transmissive sheet 4. The light-transmissive sheet 4 is layered on the first main surface 1c of the light guiding plate 1, whereby the light-cutting scattering layers 3 are disposed so as to respectively cover the optical function parts 2. The light-cutting scattering layers 3 are layered on the light-transmissive sheet 4. The light-transmissive sheet 4 is a scattering sheet that scatters and transmits transmitting light. The light emitting module 100 including the light-transmissive sheet 4 as a scattering sheet may reduce luminance non-uniformity of the light emitting module 100 by the light-transmissive sheet 4, and may further reduce luminance non-uniformity by the light-cutting scattering layers 3. The light-transmissive sheet 4 may be configured as a highly light-transmissive sheet to which no white-color pigment is added. The light-transmissive sheet 4 can be configured as a light-transmissive resin sheet formed of PET or the like containing a white-color pigment, of which the thickness preferably is in a range of about 100 μm to 1000 μm, more preferably 100 μm to 500 μm. The white-color pigment of the light-transmissive sheet 4 is inorganic white-color powder such as titanium oxide.

The light-cutting scattering layers 3 are preferably formed of light-transmissive resin such as silicone resin containing a white-color pigment. The light-cutting scattering layers 3 preferably has a smaller light transmittance to light transmitting in the thickness direction than the light transmittance of the light-transmissive sheet 4 in the thickness direction. This is explained as follows. The light-transmissive sheet 4 may reduce luminance non-uniformity over the entire light emitting module, whereas the light-cutting scattering layers 3 may inhibit concentration of luminance at the central part around the light emitting element 11 thereby reducing luminance non-uniformity. The transmittance of the light-cutting scattering layers 3 cutting light transmitting in the thickness direction preferably in a range of 0.1/10 to 7/10, further preferably 0.3/10 to 5/10. The transmittance of the light-cutting scattering layers 3 may be adjusted to a suitable value taking into consideration of the thickness of the light guiding plate 1, the area of the light emitting surface 11a of each light emitting element 11, the light-emission intensity of each light emitting element 11, the shape of each optical function part 2 and the like.

The light-cutting scattering layers 3 are layered on the surface of the light-transmissive sheet 4, or integrated with the light-transmissive sheet 4, and disposed so as to respectively cover the optical function parts 2. The light-cutting scattering layers 3 layered on the light-transmissive sheet 4 preferably has a smaller transmittance to transmitting light than the transmittance of the light-transmissive sheet 4. This is explained as follows. The light-cutting scattering layers 3 cut light being incident from the optical function parts 2 to locally cut the light before outputting the light from the light emitting module 100, thereby reducing luminance non-uniformity. The light-transmissive sheet 4 configured as a scattering sheet scatters light before outputting the light from the entire surface of the light emitting module 100, thereby reducing luminance non-uniformity.

The light-cutting scattering layers 3 disposed at predetermined positions on the light-transmissive sheet 4 are bonded to the surface of the light-transmissive sheet 4 which surface faces to the light guiding plate 1. In the light emitting module 100, light transmitting through the optical function parts 2 transmits through the light-cutting scattering layers 3, and further transmits through the light-transmissive sheet 4, thereby efficiently reducing luminance non-uniformity. In particular, the light-cutting scattering layers 3 is disposed on the light-transmissive sheet 4 as a scattering sheet so as to be disposed on the surface of the light-transmissive sheet 4 facing the light guiding plate 1, thereby effectively minimizing luminance non-uniformity. Alternatively, the light-cutting scattering layer may be disposed on the side of the light-transmissive sheet opposite to the surface facing the light guiding plate. This light emitting module may have a structure in which light transmits through the optical function parts and then the light-transmissive sheet to transmit through the light-cutting scattering layers. The light emitting module 100 including the light-cutting scattering layers 3 layered on the light-transmissive sheet 4 of a scattering sheet may more effectively reduce luminance non-uniformity by including the light-cutting scattering layers 3 disposed on the surface facing the light guiding plate 1, as compared to the structure having the light-cutting scattering layers 3 disposed on the opposite side of the surface facing the light guiding plate 1. This is because light of which luminance non-uniformity is reduced by the light-cutting scattering layers 3 is transmitted through the scattering sheet.

The light emitting module 100 may include the light-cutting scattering layers 3 and the light-transmissive sheet 4 as an integrated structure, in which the light-cutting scattering layers 3 are partially provided on the light-transmissive sheet 4. The light-transmissive sheet 4 may be a light-transmissive plastic sheet including a region where pigment or dye is added to form the light-cutting scattering layers 3. The plastic sheet of the light-transmissive sheet 4 may be, for example, a fluorine resin film having a thickness preferably in a range of 50 μm to 500 μm. In the light-transmissive sheet 4 of the scattering sheet which is integrated with the light-cutting scattering layers 3, different concentration or material of the pigment or dye is employed between the region of the light-cutting scattering layers 3 and the region of the scattering sheet. The light-cutting scattering layers 3 preferably has a smaller light transmittance than the light transmittance of the scattering sheet, and this may be achieved by the light-cutting scattering layer 3 containing a greater amount of pigment or dye than that contained in the scattering sheet.

The light-cutting scattering layers 3 disposed at predetermined positions on the light-transmissive sheet 4 are disposed so as to respectively cover the optical function parts 2. The light-transmissive sheet 4 is partially bonded to the light guiding plate 1 to be disposed at predetermined positions of the light guiding plate 1. In the light emitting module 100 including the quadrangular light-transmissive sheet 4 on the first main surface 1c side of the quadrangular light guiding plate 1, the light-transmissive sheet 4 may be disposed at predetermined positions in the light guiding plate 1 having its one side bonded to the light guiding plate 1. In the light emitting module 100, the light-transmissive sheet 4 is layered on the surface of the light guiding plate 1 in a planar state in a state in which the light-transmissive sheet 4 and the light guiding plate 1 are different from each other in thermal contraction with temperature variations. Thus, the light-cutting scattering layers 3 are disposed near the optical function parts 2 in the light guiding plate 1.

The size of the light-cutting scattering layers 3 may appropriately be set. As seen in a top view, the light-cutting scattering layers 3 are each greater in outline than each optical function part 2 and cover the entire optical function part 2. The light-cutting scattering layers 3 scatter thereby cutting light emitted from the optical function parts 2, to inhibit luminance concentration and reduce luminance non-uniformity before the light exits to outside. In the light emitting module 100 in which the light emitting elements 11 are arranged in a matrix at the second main surface 1d of the light guiding plate 1, luminance is higher around each light emitting element 11. Light emitted by the light emitting elements 11 transmits through the wavelength conversion parts 12 to the optical function parts 2, and then transmits through the optical function parts 2 to the light-cutting scattering layers 3, whereby the light may exit to outside with reduced luminance non-uniformity. In the light guiding plate 1 in which the optical function parts 2 is configured as the recesses 1a, the thickness of the optical function parts 2 is reduced at its central part. The recess 1a having the flat part 1y at their central part may contribute to reducing the unfavorable effect such as luminance non-uniformity attributed to relative misalignment between the optical function parts 2 and the light emitting elements 11. Providing the flat part 1y reduces the thickness of particular regions in the light guiding plate 1. This may unfavorably increase intensity of the transmitting light, and invites luminance non-uniformity. The light-cutting scattering layers 3 scatter and cut light transmitting through the flat parts 1y as well, thereby inhibiting luminance concentration. This may effectively reduce luminance non-uniformity by transmitted light. Light transmitting through the optical function parts 2 becomes incident on the light-cutting scattering layers 3 in various directions. The light-cutting scattering layers 3 cut and scatter such light being incident in various directions, thereby reducing the intensity of the luminance of the transmitting light, to reduce luminance non-uniformity.

Recesses 1b

The light guiding plate 1 may include the recesses 1b on the second main surface 1d side. The recesses 1b may have any shape so long as being capable of serving as the reference in mounting the light emitting elements 11. Specifically, for example, each recess 1b may be a recess shown in FIGS. 2B, 2C, and 4A, a projection, a groove or the like.

The size of each recess 1b as seen in a top view may be in a range of, for example, 0.05 mm to 10 mm, preferably 0.1 mm to 1 mm. The depth thereof may be in a range of 0.05 mm to 4 mm, preferably 0.1 mm to 1 mm. The distance between the optical function part 2 and the corresponding recess 1b may appropriately be set to the extent in which the optical function part 2 and the recess 1b are apart from each other.

The shape of each recess 1b as seen in a top view is, for example, substantially quadrangular or substantially circular, and may be selected depending on the arrangement interval of the recesses 1b or the like. In the case in which the arrangement intervals of the recesses 1b (i.e., the distance between two recesses which are closest to each other) are substantially constant, the shape of the recesses 1b are preferably substantially circular or substantially square. Specifically, the recess 1b having a substantially circular shape may well spread light from the light emitting elements 11.

Light Emitting Element Units 10

The light emitting element units 10 each include the light emitting element 11, the wavelength conversion part 12 covering the main light emitting surface 11c of the light emitting element 11, and the light-reflective member 16 covering the lateral surfaces of the light emitting element 11.

Figure 3A:
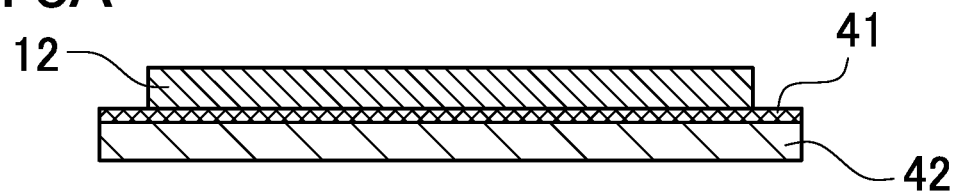
FIG. 3A is an enlarged schematic cross-sectional view showing an exemplary operation in manufacturing the light emitting element unit according to Embodiment 1 of the present disclosure.
Figure 3B:
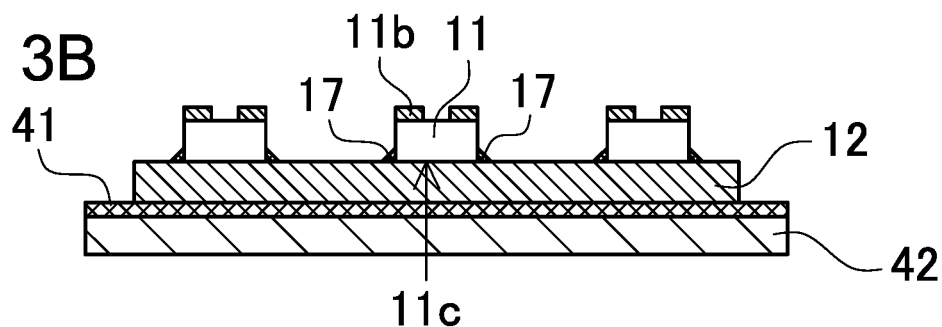
FIG. 3B is an enlarged schematic cross-sectional view showing an exemplary operation in manufacturing the light emitting element unit according to Embodiment 1 of the present disclosure.
Figure 3C:
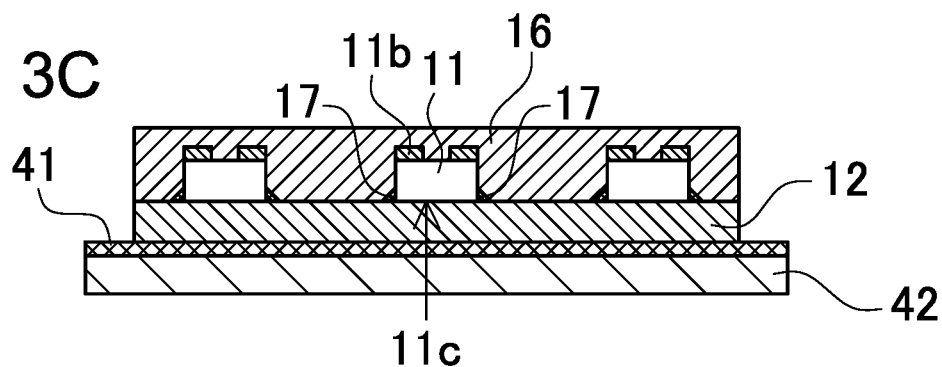
FIG. 3C is an enlarged schematic cross-sectional view showing an exemplary operation in manufacturing the light emitting element unit according to Embodiment 1 of the present disclosure.
Figure 3D:
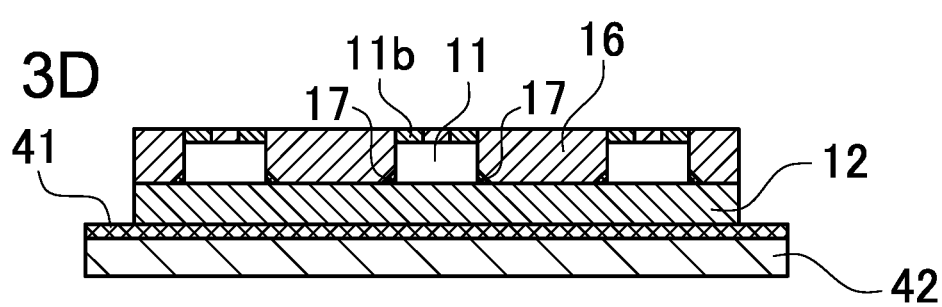
FIG. 3D is an enlarged schematic cross-sectional view showing an exemplary operation in manufacturing the light emitting element unit according to Embodiment 1 of the present disclosure.
Figure 3E:
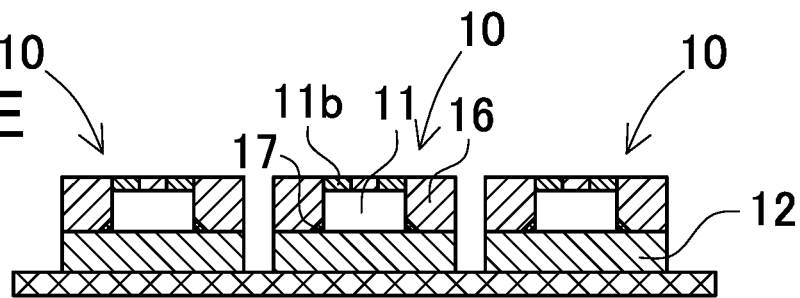
FIG. 3E is an enlarged schematic cross-sectional view showing an exemplary operation in manufacturing the light emitting element unit according to Embodiment 1 of the present disclosure.

The light emitting element units 10 shown in FIG. 3E each include the light emitting element 11 bonded to the surface of the wavelength conversion part 12, so that the main light emitting surface 11c of the light emitting element 11 is covered with the wavelength conversion part 12. The light emitting element 11 is bonded to the surface of the wavelength conversion part 12 via the light-transmissive adhesive member 17. In each light emitting element unit 10 shown in FIG. 3E, the outline of the wavelength conversion part 12 as seen in a top view is greater than the outline of the light emitting element 11. The light emitting element unit 10 allows a greater amount of light emitted from the main light emitting surface 11c of the light emitting element 11 to transmit through the wavelength conversion part 12 and to be incident on the light guiding plate 1, thereby reducing color non-uniformity or luminance non-uniformity. The light emitting element unit 10 also includes the light-reflective member 16 covering the lateral surfaces of the light emitting element 11. In each light emitting element unit 10 shown in the drawing, the outer lateral surfaces of the light-reflective member 16 and the outer lateral surfaces of the wavelength conversion part 12 are substantially flush with each other.

Wavelength Conversion Parts 12

The light emitting module 100 according to the present embodiment may include the wavelength conversion parts 12 that diffuse light from the light emitting elements 11 thereby converting the wavelength of light from the light emitting elements 11.

As shown in FIG. 2B, the wavelength conversion parts 12 are each provided between the corresponding light emitting element 11 and the light guiding plate 1 while being positioned on the second main surface 1d side of the light guiding plate 1. Each wavelength conversion part 12 diffuses and levels inside the light received from the light emitting element 11. In the light emitting module 100 in the drawings, each light emitting element unit 10 includes the light emitting element 11 and the wavelength conversion part 12 integrated with each other, so that the main light emitting surface 11c of the light emitting element 11 is covered with the wavelength conversion part 12. For the purpose of reducing the thickness of the light emitting module, each wavelength conversion part 12 is preferably disposed in the corresponding recess 1b of the light guiding plate 1 as shown in FIG. 2B.

Figure 5:
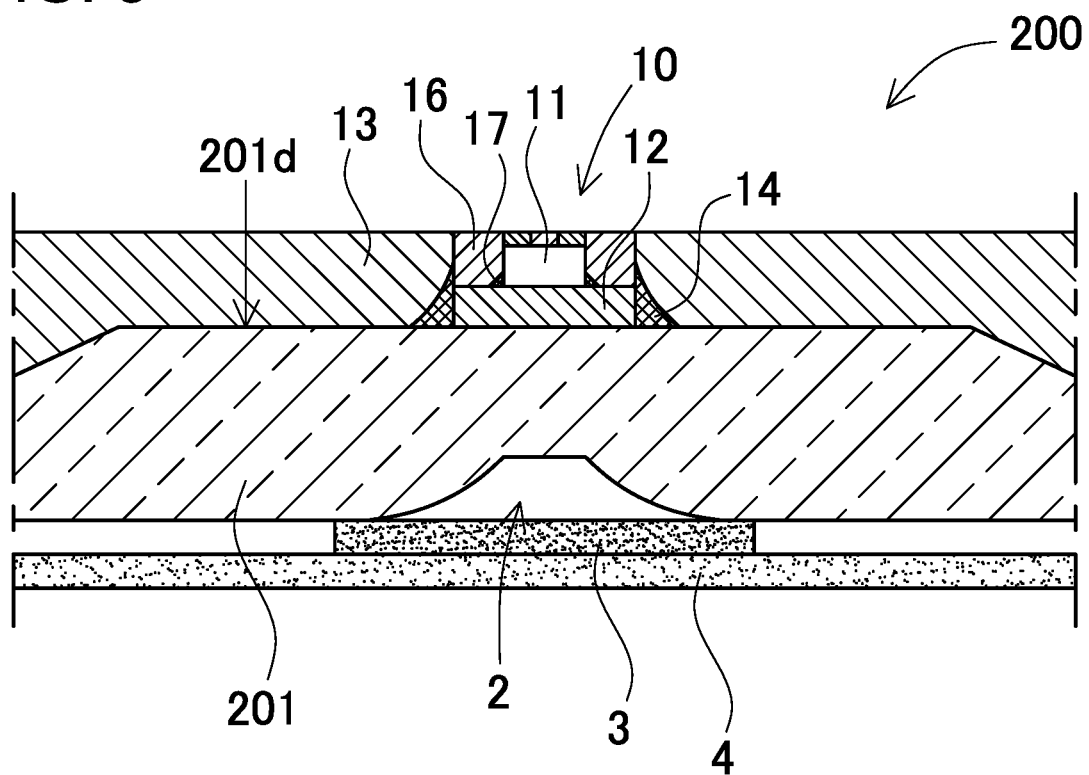
FIG. 5 is an enlarged schematic cross-sectional view of a light emitting module according to other embodiment of the present disclosure.

As in a light emitting module 200 shown in FIG. 5, the wavelength conversion parts 12 may be disposed on a flat second main surface 201d of a light guiding plate 201. The light emitting module 200 in FIG. 5 includes the wavelength conversion part 12 of the light emitting element unit 10 bonded onto the flat second main surface 201d of the light guiding plate 201. In this manner, the wavelength conversion part 12 is disposed between the light guiding plate 201 and the light emitting element 11. The light emitting element unit 10 may be bonded, for example, via a light-transmissive adhesive member 17. In this manner, the wavelength conversion part 12 may be provided so as to project from the surface of the second main surface 201d.

While not shown in the drawings, the light emitting module may include wavelength conversion parts which are formed by supplying a wavelength conversion material into recesses formed at the light guiding plate. The light emitting module preferably includes such a plurality of wavelength conversion parts being apart from one another. This can contribute to reducing the wavelength conversion material. Preferably, one wavelength conversion part is provided to each of the light emitting elements. Thus, leveling light from the light emitting elements by the wavelength conversion parts can reduce luminance non-uniformity and color non-uniformity.

The wavelength conversion parts formed by supplying a wavelength conversion material in the recesses can be formed by, for example, potting, printing, spraying or the like. In the case in which the wavelength conversion parts are formed by disposing the wavelength conversion material inside each of the recesses of the light guiding plate, for example, the wavelength conversion material in a liquid state can be disposed on the second main surface of the light guiding plate, and then slid on the second main surface with a squeegee or the like to be supplied into the recesses. Thus, the wavelength conversion parts are manufactured with good mass-productivity.

Alternatively, the wavelength conversion part provided in each recess may employ a previously molded article, and the molded article may be disposed inside each recess of the light guiding plate or on the second main surface of the light guiding plate. The molded articles for the wavelength conversion parts may be formed by cutting or punching a plate-like or sheet-like wavelength conversion material into individual pieces. Alternatively, the molded article pieces for the wavelength conversion parts may be formed by injection molding, transfer molding, compression molding or the like using a mold assembly. Such molded articles for the wavelength conversion parts may be respectively bonded inside the recesses or onto the second main surface of the light guiding plate using an adhesive agent or the like.

The size or shape of the wavelength conversion parts 12 may be, for example, the same as or similar to that of the recesses 1b. Preferably, the height of the wavelength conversion parts 12 is the same as or similar to that of the recesses 1b.

The first main surface 2c of the light guiding plate 1 may undergo processing so as to provide a portion with a function of diffusing or reflecting light other than the region where the optical function parts 2 exist. For example, making the portion apart from the optical function parts 2 in fine uneven shapes or a rough surface may further diffuse light, and consequently reduce luminance non-uniformity.

For the base material of the wavelength conversion parts 12, a light-transmissive material such as epoxy resin, silicone resin, mixture of epoxy resin and silicone resin, or glass may be used, for example. In view of light resistance and moldability of the wavelength conversion parts 12, silicone resin is advantageous as the base material of the wavelength conversion part 12. The base material of the wavelength conversion parts 12 preferably has a higher refractive index than the reflective index of the material of the light guiding plate 1.

The wavelength conversion material contained in the wavelength conversion parts 12 may be a fluoride-based fluorescent material such as a YAG fluorescent material, a β-SiAlON fluorescent material, a KSF-based fluorescent material or the like. In particular, at least one of the wavelength conversion parts 12 may contain a plurality of types of wavelength conversion materials, further preferably, at least one of the wavelength conversion parts 12 contains a β-SiAlON fluorescent material emitting green-based-color light and a fluoride-based fluorescent material such as a KSF-based fluorescent material emitting red-based-color light. Accordingly, the color reproduction range of the light emitting module may increase. For example, in the case in which a light emitting element 11 emitting blue-based-color light, each wavelength conversion part 12 may contain a KSF-based fluorescent material (i.e., a red-color fluorescent material) by 60 weight percent or more, preferably 90 weight percent or more, in order to obtain red-color-based light. That is, light of a specific color may be obtained by using the wavelength conversion part 12 in which at least one wavelength conversion material emitting light of a specific color is added. The wavelength conversion member may be configured as quantum dots.

In each wavelength conversion part 12, arrangement of the wavelength conversion member may be appropriately determined. For example, the wavelength conversion member may be distributed substantially evenly, or localized in density. Also, a plurality of layers each containing at least one wavelength conversion material may be layered.

The wavelength conversion parts 12 may be configured as a layer scattering light from the light emitting element 11, for example, by adding particles of $SiO_2$ or $TiO_2$ in the aforementioned resin materials.

Light Emitting Elements 11

The light emitting elements 11 are the light source of the light emitting module 100. The plurality of light emitting elements 11 is bonded to the light guiding plate 1.

The light emitting elements 11 each include the main light emitting surface 11c from which light is mainly extracted, and an electrode formed surface 11d opposite to the main light emitting surface 11c and provided with a pair of electrodes 11b. The pair of electrodes 11b is disposed so as to face the wiring board 20, and electrically connected to the wiring of the wiring board 20, for example, via a wire 15 or the like.

The light emitting elements 11 each include, for example, a light-transmissive substrate formed of sapphire or the like, and a semiconductor layered structure layered on the light-transmissive substrate. The semiconductor layered structure includes a light emitting layer, and an n-type semiconductor layer and a p-type semiconductor layer between which the light emitting layer is interposed. An n-electrode and a p-electrode are respectively electrically connected to the n-type semiconductor layer and the p-type semiconductor layer. The light emitting elements 11 are each disposed such that, for example, the main light emitting surface 11c including the light-transmissive substrate faces the light guiding plate 1, while the pair of electrodes 11b is positioned at the electrode formed surface 11d opposite to the main light emitting surface 11c. The light emitting elements 11 preferably include a nitride semiconductor ($In_xAl_yGa_{1-x-y}N$, $0 \leq X$, $0 \leq Y$, $X+Y \leq 1$) capable of emitting short wavelength light which can efficiently excites the wavelength conversion members.

The longitudinal, lateral, and height dimension of each light emitting element 11 is not particularly specified. Each light emitting element 11 is preferably a semiconductor light emitting element in a size of 1000 μm or less longitudinally and laterally as seen in a top view, further preferably 500 μm or less longitudinally and laterally, and still further preferably 200 μm or less longitudinally and laterally. Such a light emitting element may realize a high-definition image at the time of performing local dimming of the liquid crystal display device 1000. Furthermore, the light emitting elements 11 each in a size of 500 μm or less longitudinally and laterally may be obtained inexpensively, and consequently an inexpensive light emitting module 100 may be provided. A light emitting element in a size of 250 μm or less both longitudinally and laterally has a small upper surface area and, therefore, the amount of light emitted from the lateral surfaces of the light emitting element is relatively great. That is, such a light emitting element tends to emit light in a batwing distribution and, therefore, preferably employed in the light emitting module 100 according to the present embodiment in which the light emitting elements 11 are bonded to the light guiding plate 1 and the distance between the light emitting elements 11 and the light guiding plate 1 is very short.

Furthermore, in the light emitting module, preferably the optical function parts 2 having a reflecting or diffusing function such as lenses are provided to the light guiding plate 1, so as to laterally spread light from the light emitting elements 11 and to level the light-emission intensity within the plane of the light guiding plate 1. However, a light emitting module in which a plurality of optical function parts 2 is disposed so as to correspond to a plurality of light emitting elements 11 of the light guiding plate 1, may have a difficulty in positioning of small light emitting elements and optical function parts.

Furthermore, misalignment of the light emitting elements 11 and the optical function parts 2 may invites deviation of the positional relationship between the light emitting elements 11 and the optical function parts 2 from the intended design. In this case, the optical function parts 2 may fail to fully spread light, and luminance may partially reduce within the plane, that would result in luminance non-uniformity.

In the light emitting module 100 according to the present embodiment, a plurality of light emitting element units 10 is mounted on the light guiding plate 1, by using references which are the plurality of positioning parts (particularly the recesses 1b) or the optical function parts 2 previously provided at the light guiding plate 1. Thus, positioning of the light emitting elements 11 may be easily determined. This provides a good quality backlight-purpose light source precisely leveling light from the light emitting elements 11 with reduced luminance non-uniformity or reduced color non-uniformity.

As described above, preferably the positioning parts which may be used for positioning the light emitting elements 11 are provided at positions corresponding to the optical function parts 2 on the surface opposite to the surface on which the optical function parts 2 is provided, that is, at positions where the positioning parts are overlap the optical function parts 2 as seen in a see-through plan view. Specifically, alignment between the light emitting elements 11 and the optical function parts 2 may be facilitated by forming the recesses 1b as the positioning parts and bonding the wavelength conversion parts 12 of the light emitting element units 10 to the recesses 1b.

What is discussed here is other structure in which disposition of the light emitting elements as the light emitting element units in the recesses is not employed, but instead the wavelength conversion parts formed by supplying a wavelength conversion material into the recesses on the light guiding plate, and the wavelength conversion parts are respectively bonded to the light emitting elements. In this case, the wavelength conversion parts which are formed using a different material from that of the light guiding plate 1 and which may be used for manufacturing device to recognize the position. This may facilitate alignment between the light emitting elements and the optical function parts.

By covering the lateral surfaces of each light emitting element 11 with the light-reflective member 16 so as to limit the light emitting direction; providing the wavelength conversion part 12 inside the recess 1b so as to face the main light emitting surface 11c of the light emitting element 11; and extracting light mainly from the wavelength conversion part 12, the wavelength conversion part 12 capable of diffusing emitted light inside thereof may be regarded as a light emitting part. This structure may reduce influence of misalignment of each light emitting element 11 which may occur in a range as seen in a plan view despite its facing the wavelength conversion part 12.

The light emitting elements 11 are preferably each configured as quadrangular light emitting element as seen in a plan view. In particular, the upper surface of each of the light emitting elements 11 preferably has a rectangular shape having long sides and short sides. In a high-definition liquid crystal display device, several thousand or more pieces of light emitting elements 11 are used, and hence the operation of mounting the light emitting elements 11 is critical. In mounting the light emitting elements 11, when orientation misalignment (i.e., misalignment in a ±90-degree orientation) has occurred with part of the plurality of light emitting elements, such orientation misalignment may easily be visually recognized when the light emitting elements are each rectangular as seen in a plan view. Such shape of the light emitting element may have a greater distance between the p-electrode and the n-electrode, thereby facilitating formation of the wiring 15 which will be described later.

On the other hand, with square light emitting elements as seen in a plan view, light emitting elements being smaller in size may be manufactured with good mass-productivity. As to the density (i.e., the arrangement interval) of the light emitting elements 11, the distance between the light emitting elements 11 may be in a range of, for example, about 0.05 mm to 20 mm, preferably about 1 mm to 10 mm.

The plurality of light emitting elements 11 is arranged in a matrix on the light guiding plate 1 as seen in a plan view. Preferably, as shown in FIG. 2A, the plurality of light emitting elements 11 is arranged at a predetermined interval in two perpendicular directions, that is, in x-direction and y-direction. Arrangement intervals px in the x-direction and arrangement intervals py in the y-direction of the plurality of light emitting elements 11 may be identical to each other as shown in FIG. 2A or may be different from each other. The two arrangement directions may not be perpendicular to each other. The arrangement interval in the x-direction or the y-direction is not specified to a regular interval, and may be an irregular interval. For example, the light emitting elements 11 may be arranged such that the intervals become greater as approaching farther from the center on the light guiding plate 1. The interval between the light emitting elements 11 refers to the distance between the optical axes of the light emitting elements 11.

The light emitting elements 11 may be configured as a known semiconductor light emitting element. In the present embodiment, the light emitting elements 11 are exemplarily light emitting diodes. The light emitting elements 11 emit blue-color light, for example. The light emitting elements 11 may each be a light source that emits white-color light. The light emitting elements 11 may respectively emit light with different colors. For example, the light emitting module 100 may include light emitting elements respectively emitting red-, blue-, and green-color light, so that white-color light is emitted as a combination of red-, blue-, and green-color light.

The light emitting elements 11 may each be an element that emits light of an appropriately determined wavelength. For example, an element emitting blue- or green-color light may be a light emitting element using a nitride-based semiconductor ($In_xAl_yGa_{1-x-y}N$, $0 \leq X$, $0 \leq Y$, $X+Y \leq 1$) or GaP. An element emitting red-color light may be a light emitting element using semiconductor such as GaAlAs, AlInGaP. A semiconductor light emitting element formed of other material may also be used. Various light emission wavelengths may be selected depending on the material and the rate of mixed crystal of the semiconductor layer. The composition, color of the emitted light, size, the number of the employed light emitting elements may appropriately be selected depending on the intended use.

Light-Transmissive Adhesive Member 17

The light-transmissive adhesive member 17 bonds between the surface of each wavelength conversion part 12 and the main light emitting surface 11c of each light emitting element 11. As shown in FIG. 3E, the light-transmissive adhesive member 17 also covers part of the lateral surfaces of the light emitting element 11 and part of the wavelength conversion part 12. Preferably, at least one of the outer lateral surfaces of the light-transmissive adhesive member 17 is an inclined surface spreading from the lateral surface of the light emitting element 11 toward the wavelength conversion part 12, and further preferably a curved surface projecting toward the light emitting element 11.

The light-transmissive adhesive member 17 is preferably disposed in a limited range inner than the outer edge of the corresponding wavelength conversion part 12 in a plan view as seen from the first main surface 1c of the light guiding plate 1. Thus, light emitted from the lateral surface of each light emitting element 11 can efficiently enter into the wavelength conversion part 12, whereby the light extraction efficiency improves.

The light-transmissive adhesive member 17 may be provided between the main light emitting surface 11c of each light emitting element 11 and the corresponding wavelength conversion part 12. Thus, for example in the case in which the light-transmissive adhesive member 17 contains a diffusing member or the like, light emitted from the main light emitting surface 11c of the light emitting elements 11 is diffused at the light-transmissive adhesive member 17 before entering the wavelength conversion part 12. This can reduce luminance non-uniformity.

The light-transmissive adhesive member 17 can be formed of a material identical to that of the light-transmissive bonding member 14 which will be described later.

Light-Reflective Member 16

In each light emitting element unit 10, at least part of the lateral surfaces of the light emitting element 11 are covered with the light-reflective member 16 in a state in which the light emitting element 11 is provided with the wavelength conversion part 12. Specifically, the light-reflective member 16 covers the lateral surfaces of the light emitting element 11 not covered with the light-transmissive adhesive member 17 and the outer lateral surfaces of the light-transmissive adhesive member 17.

The light-reflective member 16 is formed of a highly light-reflective material, and is preferably white-color resin formed of transparent resin containing white-color powder or the like which is a light-reflective additive. In each light emitting element unit 10, the light-reflective member 16 covers the surfaces of the light emitting element 11 other than the main light emitting surface 11c. This can reduce leakage of light in directions other than the direction toward the main light emitting surface 11c. That is, the light-reflective member 16 reflects light emitted from the lateral surfaces or the electrode formed surface 11d of the light emitting element 11, so that light emitted from the light emitting element 11 can effectively exit to the outside from the first main surface 1c of the light guiding plate 1 to improve the light extraction efficiency of the light emitting module 100.

The light-reflective member 16 is suitably formed of white-color resin which reflects light emitted from the light emitting element 11 by 60% or more, preferably 90% or more. The light-reflective member 16 is preferably formed of resin containing a white-color pigment such as white-color powder. In particular, the light-reflective member 16 is preferably formed of silicone resin containing inorganic white-color powder such as titanium oxide.

The light-reflective member 16 is in contact with at least part of the lateral surfaces of the light emitting element 11. The light-reflective member 16 is present around the light emitting element 11, and embeds the light emitting element 11, while exposing the electrodes 11b of the light emitting element 11 at the surface. The light-reflective member 16 is in contact with the wavelength conversion part 12, and the outer lateral surfaces of the light-reflective member 16 and the outer lateral surfaces of the wavelength conversion part 12 are substantially flush with each other. The light-reflective member 16 is disposed at the light guiding plate 1 through disposing the light emitting element unit 10 in which the light emitting element 11 and the wavelength conversion part 12 are integrally bonded to each other.

Light-Transmissive Bonding Member 14

Each light emitting element unit 10 may be bonded to the light guiding plate 1 with the light-transmissive bonding member 14. In the present embodiment, the light-transmissive bonding member 14 is in contact with the inner lateral surfaces of the recess 1b and the outer lateral surfaces of the light emitting element unit 10. The light-transmissive bonding member 14 is disposed so as to be in contact with part of the light-reflective member 16 positioned outer than the recess 1b, in other words, so as to cover the region including the outer lateral surfaces of the wavelength conversion part 12 and the outer lateral surfaces of the light-reflective member 16. Thus, light emitted in the lateral direction of the light emitting element unit 10 can efficiently enter inside the light-transmissive bonding member 14, thereby improving the light emission efficiency of the light emitting module 100. In the case in which the light-transmissive bonding member 14 covers the lateral surfaces of the light emitting element unit 10, as shown in FIG. 2B, the light-transmissive bonding member 14 preferably spreads toward the light guiding plate 1 as seen in a cross-sectional view. At least one of the outer lateral surfaces of the light-transmissive bonding member 14 is an inclined surface, forming an acute angle with the corresponding outer lateral surface of the light-reflective member 16. Thus, light emitted in the lateral direction of the light emitting element 11 can efficiently exit in the direction toward the light guiding plate 1.

The light-transmissive bonding member 14 may be disposed between each wavelength conversion part 12 and the bottom surface of the corresponding recess 1b.

As shown in FIG. 3E, the light-transmissive bonding member 14 is in contact with the second main surface 1d of the light guiding plate 1. This can widen the region where the inclined surface is formed, and consequently a greater amount light is reflected. Accordingly, luminance non-uniformity can be reduced.

As shown in FIG. 3E, the light-transmissive bonding member 14 has at least one inclined surfaces as seen in a cross-sectional view. With this structure, light transmitting through the light-transmissive bonding member 14 and being incident on the inclined surfaces is evenly reflected toward the light exiting surface.

The light-transmissive bonding member 14 may be formed of a light-transmissive thermosetting resin material such as epoxy resin, silicone resin or the like. The light-transmissive bonding member 14 transmits light by 60% or more, preferably 90% or more. The light-transmissive bonding member 14 may contain a diffusing member or white-color powder which is a light-reflective additive. Alternatively, the light-transmissive bonding member 14 may be formed of solely the light-transmissive resin material without containing any diffusing member or white-color powder.

In the case in which each light emitting element 11 includes a light-transmissive substrate, the light-transmissive bonding member 14 preferably covers at least part of the lateral surfaces of the light-transmissive substrate. This can upwardly extract portion of light emitted from the light emitting layer which has propagated through the light-transmissive substrate and has exited in the lateral direction. The light-transmissive bonding member 14 preferably covers at least half the lateral surfaces of the light-transmissive substrate in the height direction. The light-transmissive bonding member 14 is further preferably in contact with the sides formed between the lateral surfaces and the electrode formed surface 11d of the light emitting element 11.

Encapsulating Member 13

The encapsulating member 13 encapsulates the lateral surfaces of a plurality of light emitting element units 10, the second main surface 1d of the light guiding plate 1, and the lateral surfaces of the light-transmissive bonding member 14. This structure can reinforce the light emitting element units 10 and the light guiding plate 1. The encapsulating member 13 as a light-reflective member allows light emitted from the light emitting elements 11 to efficiently enter the light guiding plate 1. The encapsulating member 13 may serve as both a member protecting the light emitting element units 10 and a reflecting member provided at the surface opposite to the light exiting surface of the light guiding plate 1. This can reduce the thickness of the light emitting module 100.

The encapsulating member 13 is preferably a light-reflective member. The encapsulating member 13 being a light-reflective member reflects light emitted by the light emitting elements 11 by 60% or more, preferably 90% or more.

The material of the encapsulating member 13 being a light-reflective member is preferably resin containing a white-color pigment or the like. In particular, silicone resin containing titanium oxide is preferable. Thus, using a large amount of inexpensive raw material such as titanium oxide as the material used in a relatively large amount for covering one surface of the light guiding plate 1, an inexpensive light emitting module 100 can be provided.

Wiring 15

The light emitting module 100 may include the wiring 15 that is electrically connected to the electrodes 11b of each of the plurality of light emitting elements 11. The wiring 15 may be formed on the surface of the encapsulating member 13 or the like opposite to the first main surface 1c of the light guiding plate 1. The wiring 15, for example, may electrically connect between the plurality of light emitting elements 11, and a circuit necessary for local dimming of the liquid crystal display device 3000 or the like may easily be formed.

Figure 4A:
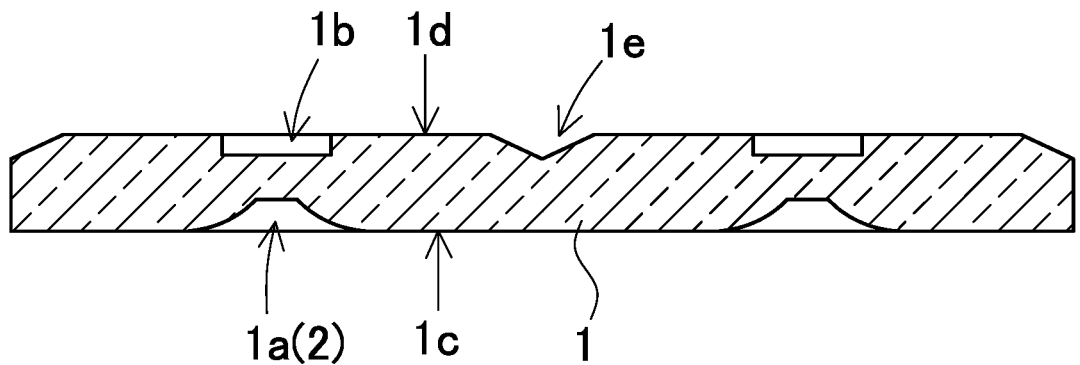
FIG. 4A is an enlarged schematic cross-sectional view showing an exemplary operation in manufacturing the light emitting module according to Embodiment 1 of the present disclosure.
Figure 4B:
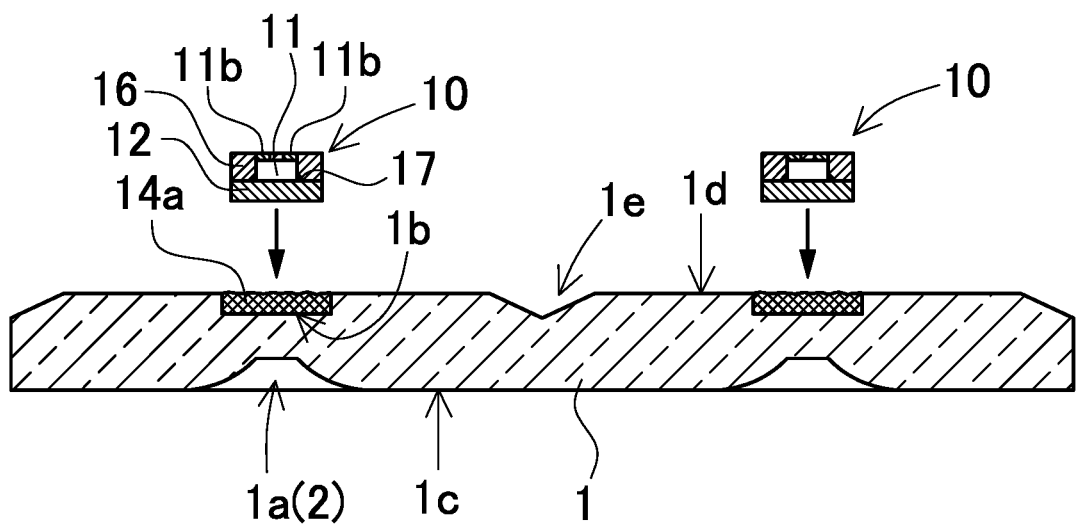
FIG. 4B is an enlarged schematic cross-sectional view showing an exemplary operation in manufacturing the light emitting module according to Embodiment 1 of the present disclosure.
Figure 4C:
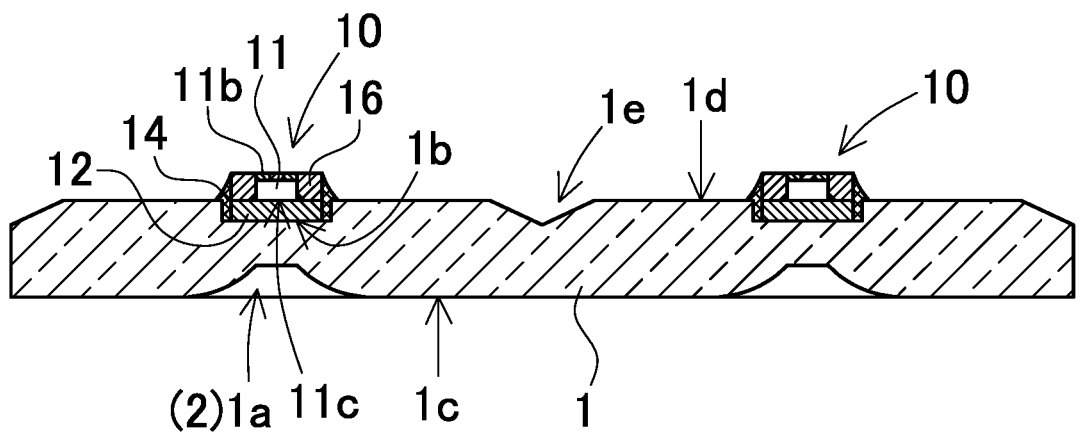
FIG. 4C is an enlarged schematic cross-sectional view showing an exemplary operation in manufacturing the light emitting module according to Embodiment 1 of the present disclosure.
Figure 4D:
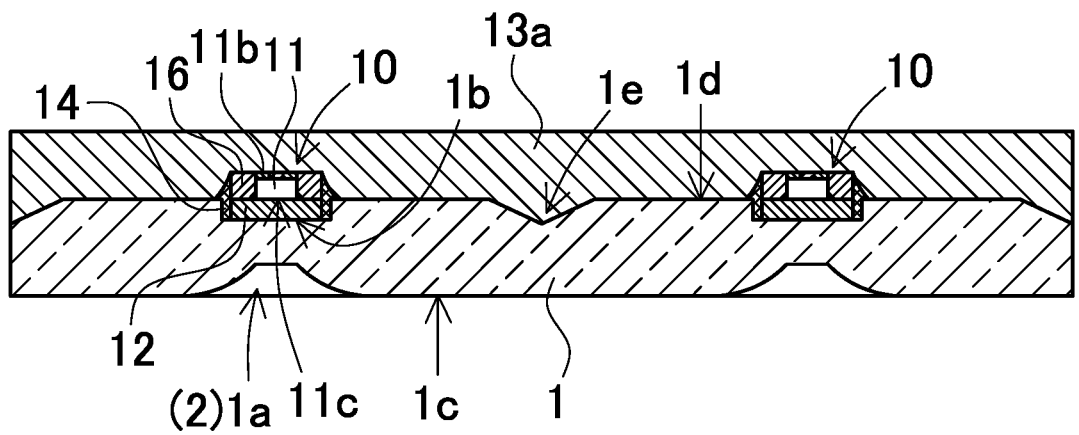
FIG. 4D is an enlarged schematic cross-sectional view showing an exemplary operation in manufacturing the light emitting module according to Embodiment 1 of the present disclosure.
Figure 4E:
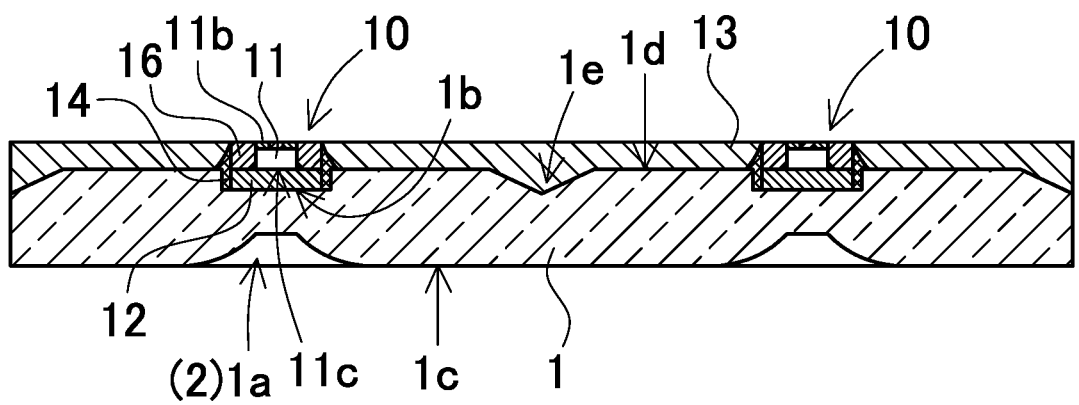
FIG. 4E is an enlarged schematic cross-sectional view showing an exemplary operation in manufacturing the light emitting module according to Embodiment 1 of the present disclosure.
Figure 4F:
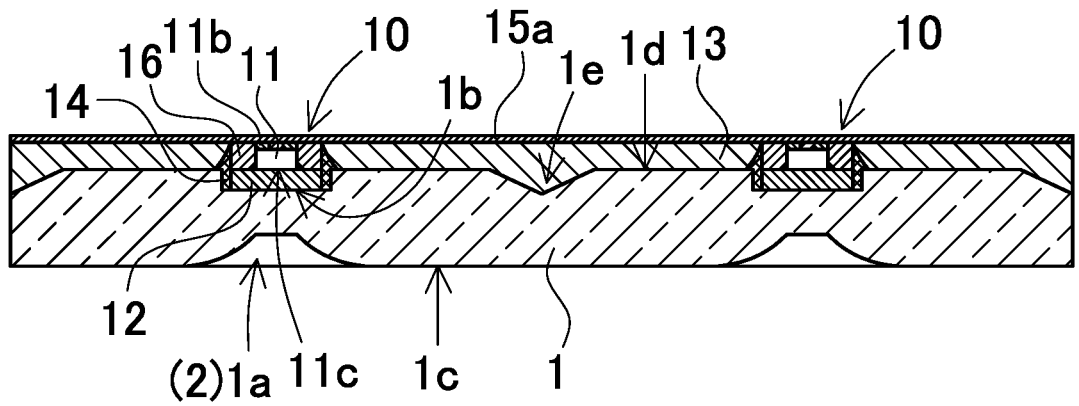
FIG. 4F is an enlarged schematic cross-sectional view showing an exemplary operation in manufacturing the light emitting module according to Embodiment 1 of the present disclosure.
Figure 4G:
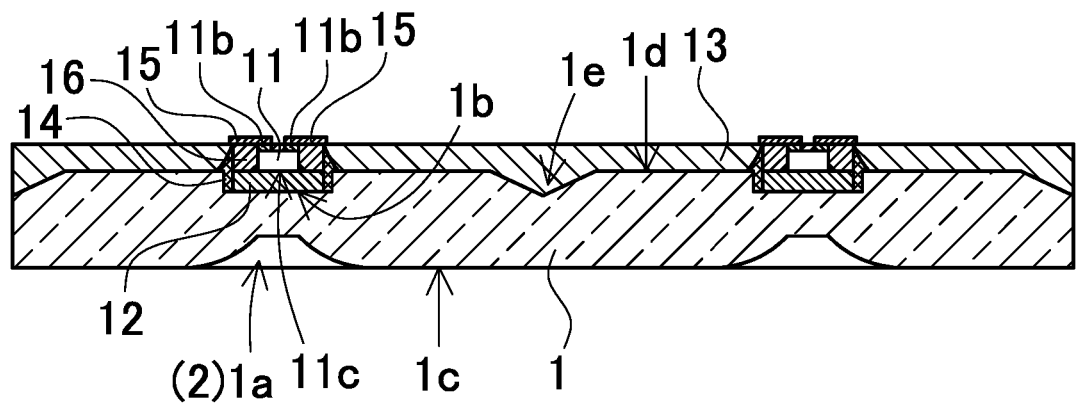
FIG. 4G is an enlarged schematic cross-sectional view showing an exemplary operation in manufacturing the light emitting module according to Embodiment 1 of the present disclosure.
Figure 4H:
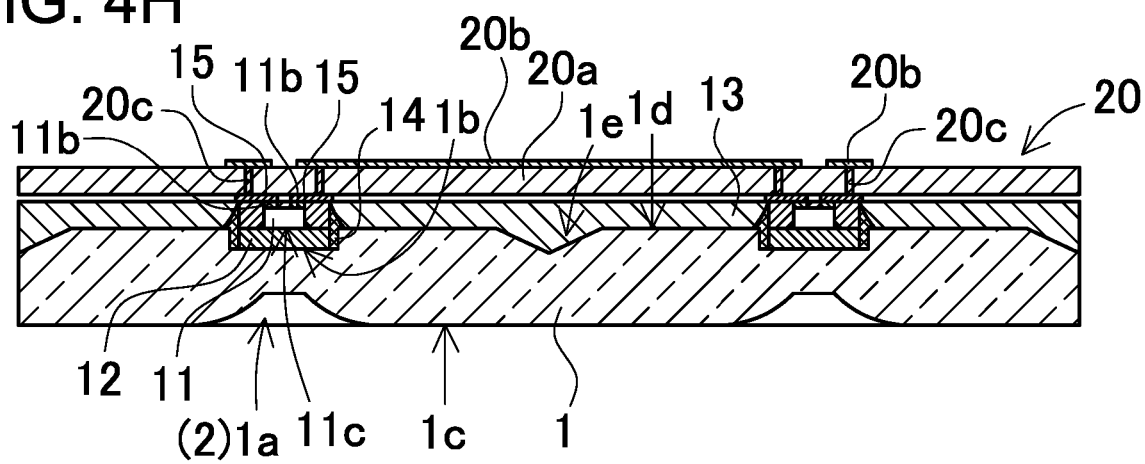
FIG. 4H is an enlarged schematic cross-sectional view showing an exemplary operation in manufacturing the light emitting module according to Embodiment 1 of the present disclosure.

For example as shown in FIGS. 4G and 4H, the wiring 15 may be formed by: exposing the positive and negative electrodes 11b of the light emitting element 11 at the surface of the encapsulating member 13; forming a metal film 15a on substantially the entire surfaces of the electrodes 11b of the light emitting element 11 and that the entire surface of the encapsulating member 13; and partially removing the metal film 15a with laser or the like so as to achieve pattering.

Wiring Board 20

Figure 4I:
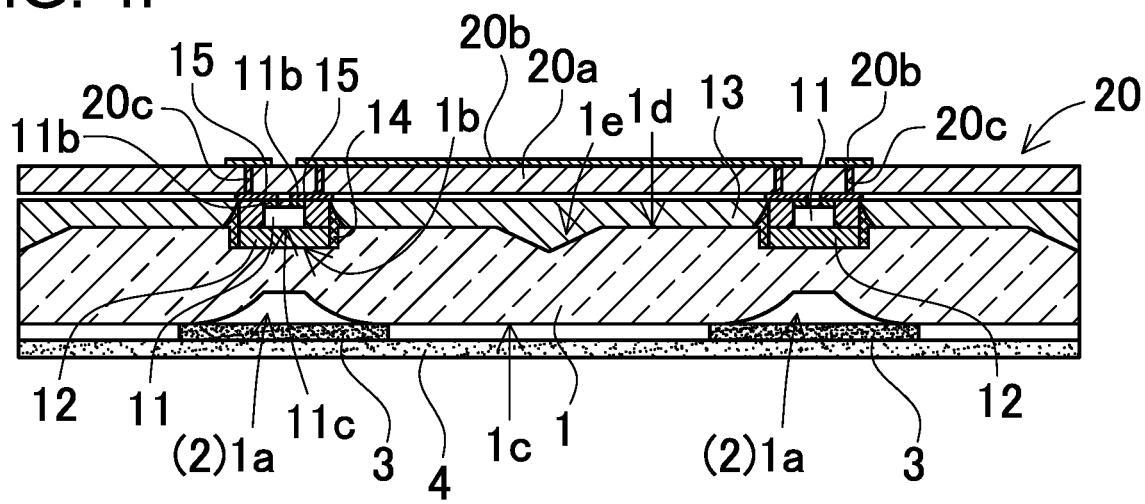
FIG. 4I is an enlarged schematic cross-sectional view showing an exemplary operation in manufacturing the light emitting module according to Embodiment 1 of the present disclosure.

As shown in FIG. 4I, the light emitting module 100 of the present disclosure may include a wiring board 20. Thus, complicated wiring necessary for local dimming and the like may easily be formed. The wiring board 20 may be provided by: mounting the light emitting elements 11 on the light guiding plate 1, and forming the encapsulating member 13 and the wiring 15 as not required step; and thereafter bonding the wiring board 20 including a wiring layer 20b to the electrodes 11b or the wiring 15 of the light emitting elements. In providing the wiring 15 connected to the light emitting elements 11, the wiring 15 being greater in shape than the planar shape of the electrodes 11b of the light emitting element 11 can facilitate electrical connection between the wiring board 20 and the light emitting elements 11 and the like.

The wiring board 20 is a board including an insulating base member 20a, the wiring layer 20b electrically connected to the plurality of light emitting elements 11 and the like. The wiring board 20 has a structure in which, for example, conductive members 20c are formed in a plurality of via holes provided at the insulating base member 20a, and the wiring layer 20b electrically connected to the conductive members 20c on both sides of the base member 20a.

The wiring board 20 may be formed using an appropriately selected material. For example, ceramic or resin may be used. In view of lower costs and moldability, resin may be selected as the material of the base member 20a. Examples of the usable resin include phenolic resin, epoxy resin, polyimide resin, BT resin, polyphthalamide (PPA), polyethylene terephthalate (PET), unsaturated polyester, or a composite material such as glass epoxy. The wiring board 20 may be configured as a rigid circuit board or a flexible circuit board. In the light emitting module 100 according to the present embodiment, the positional relationship between the light emitting elements 11 and the light guiding plate 1 is previously determined. Accordingly, even if the base member 20a of wiring board 20 is formed using a material which may warp or expand by heat or the like, misalignment between the light emitting elements 11 and the light guiding plate 1 is less likely to occur. Hence, a board made of an inexpensive material such as glass epoxy or having a small thickness may be employed as appropriate.

The wiring layer 20b is configured as, for example, conductive foil (i.e., a conductive layer) provided on the base member 20a, and electrically connected to the plurality of light emitting elements 11. The material of the wiring layer 20b preferably has high thermal conductivity. Such a material may be, for example, an electrically conductive material such as copper. The wiring layer 20b may be formed by plating, applying electrically conductive paste, printing or the like. The thickness of the wiring layer 20b may be in a range of, for example, about 5 µm to 50 µm.

The wiring board 20 may be bonded to the light guiding plate 1 and others by any method. For example, the bonding may be achieved by disposing an adhesive sheet between the surface of the encapsulating member 13 provided on the opposite side of the light guiding plate 1 and the surface of the wiring board 20, and applying pressure. Electrical connection between the wiring layer 20b of the wiring board 20 and the light emitting elements 11 may be established by an appropriately determined method. The conductive members 20c are bonded to the wiring 15, for example, by melting the conductive members 20c which is metal embedded in the via holes by applying pressure and heat.

The wiring board 20 may have a layered structure. For example, as the wiring board 20, a metal plate on which an insulating layer is provided may be employed. The wiring board 20 may be a TFT board having a plurality of TFTs (Thin-Film Transistors).

Method of Manufacturing Light Emitting Module 100

In the following, a description will be given of an exemplary method of manufacturing the light emitting module according to the present embodiment. The light emitting element units 10 are provided. FIGS. 3A to 3E show exemplary operations in manufacturing the light emitting element units 10.

In the operation shown in FIG. 3A, the wavelength conversion part 12 covering the main light emitting surface 11c of the light emitting element 11 is formed. In this operation, the wavelength conversion part 12 is formed by a uniform thickness on the surface of a base sheet 41. The base sheet 41 is removably disposed on a plate 42.

In the operation shown in FIG. 3B, the light emitting elements 11 are bonded to the wavelength conversion part 12. The main light emitting surface 11c side of the light emitting elements 11 is bonded to the wavelength conversion part 12. The light emitting elements 11 are bonded to the wavelength conversion part 12 at a predetermined interval.

The light emitting elements 11 are bonded to the wavelength conversion part 12 via the light-transmissive adhesive member 17. The light-transmissive adhesive member 17 is applied on the wavelength conversion part 12 and/or on the main light emitting surface 11c of the light emitting elements 11, to bond the light emitting elements 11 and the wavelength conversion part 12 to each other. At this time, as shown in FIG. 3B, the applied light-transmissive adhesive member 17 creeps up the lateral surfaces of the light emitting elements 11, to cover part of the lateral surfaces of the light emitting elements 11. The light-transmissive adhesive member 17 may also be disposed between the wavelength conversion part 12 and the main light emitting surfaces 11c of the light emitting elements 11.

As shown in FIG. 3E, in relation to the interval of the light emitting elements 11, the region between the light emitting elements 11 is cut to provide the outline of each pieces of the wavelength conversion part 12 with predetermined dimension. The interval of the light emitting elements 11 determines the outline of each wavelength conversion part 12.

In the operation shown in FIG. 3C, the light-reflective member 16 is formed so as to embed the light emitting elements 11. The light-reflective member 16 is preferably formed of white-color resin. The light-reflective member 16 is disposed on the wavelength conversion part 12, and cures while the light emitting elements 11 are embedded therein. The light-reflective member 16 is disposed by a thickness by which the light emitting elements 11 are fully embedded; in FIG. 3C, by a thickness by which the electrodes 11b of each light emitting element 11 are embedded. The light-reflective member 16 may be formed by compression molding, transfer molding, or application.

In the operation shown in FIG. 3D, part of the cured light-reflective member 16 is removed, to expose the electrodes 11b of the light emitting element 11 outside.

In the operation shown in FIG. 3E, the light-reflective member 16 and the wavelength conversion part 12 are cut to singulate the light emitting element units 10. In each singulated light emitting element unit 10, the light emitting element 11 is bonded to the wavelength conversion part 12; the light-reflective member 16 is provided around the light emitting element 11; and the electrodes 11b are exposed at the surface of the light-reflective member 16.

In relation to providing the light emitting element units, all of or part of the foregoing operations may be performed. Alternatively, the light emitting element units may be purchased.

The light emitting element units 10 manufactured through the foregoing operations are respectively bonded to the recesses 1b of the light guiding plate 1 in the operations shown in FIGS. 4A to 4C.

As shown in FIG. 4A, the light guiding plate 1 is provided. The material of the light guiding plate 1 may be, for example, polycarbonate. The optical function parts 2 being the recesses 1a are provided at the first main surface 1c. The recesses 1b each opened in a substantially square shape and the partitioning recesses 1e each being a V-shaped groove are formed on the second main surface 1d. The recesses 1b are formed to allow the wavelength conversion parts 12 of the light emitting element units 10 to be disposed at predetermined positions. The partitioning recesses 1e are linearly provided each between adjacent ones of the light emitting elements 11. The partitioning recesses 1e each include a plurality of inclined surfaces continuous to the second main surface 1d.

As seen in a plan view, each optical function part 2 is provided so as to be greater than the light emitting surface 11a of the corresponding light emitting element from which light exits and enters the light guiding plate 1, and to be smaller than the region surrounded by the partitioning recesses 1e provided on the light guiding plate 1. With the light emitting module 100 shown in FIG. 2B, light of each light emitting element 11 is intended to enter the light guiding plate 1 via the corresponding wavelength conversion part 12. Therefore, as seen in a plan view, the outline of the optical function part 2 should be greater than the wavelength conversion part 12 serving as the light emitting surface 11a of the light emitting element. Each optical function part 2 is a hollow recess 1a provided on the light guiding plate 1. At the inner surface of the recess 1a, an inclined surface 1x is provided. The inclined surface 1x is inclined so as to become closer to the center of the recess 1a as approaching closer to the light emitting element 11, with its inclination angle (a) becoming gradually greater toward the central part. At the bottom part of the recess 1a, the flat part 1y is provided. The flat part 1y is positioned at the central part of the recess 1a forming the optical function part 2, and parallel to the light emitting surface 11a of the light emitting element. The optical function parts 2 of the light guiding plate 1 each having the flat part 1y on the recess 1a allows the light guide plate 1 to have a portion having a greater thickness between the recess 1a and the wavelength conversion part 12, otherwise the portion would be the thinnest. Accordingly, the light guide plate 1 can have a relatively increased mechanical strength. In each optical function part 2, the flat part 1y is positioned on the optical axis of the corresponding light emitting element 11. In the light guiding plate 1, the recess 1a of the optical function part 2 and the center of the recess 1b of the wavelength conversion part 12 are positioned on the optical axis of the corresponding light emitting element 11. Thus, the recess 1a of the optical function part 2 is positioned at the center of the wavelength conversion part 12, that is, on the optical axis of the light emitting element 11. As seen in a top view, the outline of the optical function part 2 is smaller than the region surrounded by the partitioning recesses 1e provided at the light guiding plate 1. Accordingly, light spread by the optical function part 2 in the planar direction of the light guiding plate 1 can efficiently be extracted upward.

The light emitting element units 10 are respectively bonded to the recesses 1 on the light guiding plate 1. As shown in FIG. 4B, in each recess 1b to which a liquid material 14a of the light-transmissive bonding member is applied, part of the light emitting element unit 10 is disposed. Specifically, the wavelength conversion part 12 of each light emitting element unit 10 is disposed so as to face the bottom surface of the corresponding recess 1b. Part of the light-reflective member 16 is disposed outside the recess 1b.

As seen in a plan view, each light emitting element unit 10 is disposed so that the center of the wavelength conversion part 12 and the center of the recess 1b overlap with each other. Then, the light-transmissive bonding member 14 is cured, so that the light emitting element unit 10 is bonded to the light guiding plate 1.

In the present embodiment, as seen in a plan view, the outline of the inner lateral surfaces of each recess 1b is greater than the outline of the lateral surfaces of the corresponding light emitting element unit 10. When part of the light emitting element unit 10 is disposed in the recess 1b, space exists between the inner lateral surfaces of the recess 1b and the outer lateral surfaces of the light emitting element unit 10. In this space in the recess 1b, uncured light-transmissive bonding member 14 is applied.

By adjusting the application amount of the light-transmissive bonding member material 14a applied in each recess 1b, the light-transmissive bonding member 14 leaks from the space between the inner lateral surfaces of the recess 1b and the lateral surfaces of the light emitting element unit 10 to the outside of the recess 1b. As shown in FIGS. 4C and 2B, the light-transmissive bonding member 14 leaking from the recess 1b creeps up to the position where it is in contact with part of the light-reflective member 16, and covers part of the light-reflective member 16. The light-transmissive bonding member 14 further spreads to the position where it is in contact with the second main surface 1d. In the state covering part of the second main surface 1d, as seen in a cross-sectional view taken along a vertical line on the top view, the upper surfaces of the light-transmissive bonding member 14 form inclined surfaces from the upper end of the light emitting element unit 10 toward the outside. Each of the inclined surfaces of the light-transmissive bonding member 14 forms an acute angle with the corresponding outer lateral surfaces of the light-reflective member 16. The inclination angle is preferably in a range of 5° to 85°, more preferably 5° to 50°.

In the state in which the light emitting element unit 10 is bonded to the recess 1b, the application amount of the light-transmissive bonding member material 14a applied to the recess 1b may be enough to allow the light-transmissive bonding member 14 covering the lateral surfaces of the light emitting element unit 10 to be higher than the second main surface 1d of the light guiding plate 1, that is, the amount enough to allow the material 14a to leak out of the recess 1b.

Subsequently, as shown in FIG. 4D, a encapsulating member material 13a is formed so as to embed the second main surface 1d of the light guiding plate 1, the plurality of light emitting element units 10, and the plurality of light-transmissive bonding members 14. The encapsulating member material 13a is a light-reflective member which is a mixture of titanium oxide and silicone resin. The encapsulating member material 13a is formed by, for example, transfer molding, potting, printing, spraying or the like. The encapsulating member material 13a is formed to be thick enough to fully cover the upper surface of the electrodes 11b (i.e., the surface opposite to the light guiding plate 1) of each light emitting element 11. Subsequently, as shown in FIG. 4E, part of the encapsulating member material 13a is removed, such that the electrodes 11b of each light emitting element 11 is exposed outside from the encapsulating member 13. The removing the encapsulating member material 13a may be performed by grinding with a grinder, blasting or the like.

Subsequently, as shown in FIG. 4F, a metal film 15a of Cu/Ni/Au sequentially from the light guiding plate 1 side is formed by sputtering or the like over substantially the entire electrodes 11b of each light emitting element 11 and the encapsulating member 13.

Subsequently, as shown in FIG. 4G, the metal film 15a is patterned by laser abrasion, to form the wiring 15.

Subsequently, as shown in FIG. 4H, the wiring 15 and the separately provided wiring layer 20b for the wiring board 20 are bonded to each other under pressure having an adhesive sheet interposed between them. At this time, the wiring 15 and the wiring layer 20b are electrically connected to each other by applying pressure and heat to a conductive material supplied into part of the wiring layer 20b (i.e., via holes) to partially melt.

As shown in FIG. 4I, the light-cutting scattering layers 3 are provided at the positions opposing to the optical function parts 2 on the light guiding plate 1. The light-cutting scattering layers 3 are bonded to the surface of the light-transmissive sheet 4, and disposed at the positions covering the optical function parts 2 by the light-transmissive sheet 4 being layered on the light guiding plate 1. The light-transmissive sheet 4 has an outline substantially identical to the outline of the light guiding plate 1. For example, a quadrangular light-transmissive sheet 4 is layered on a quadrangular light guiding plate 1 at a predetermined position. The light-transmissive sheet 4 is layered at a predetermined position in the light guiding plate 1 such that part of its outer edge is bonded to the light guiding plate 1. When the light-transmissive sheet 4 has a quadrangular shape, the light-transmissive sheet 4 is layered at a predetermined position in the light guiding plate 1 such that one side of the quadrangular shape is bonded to the light guiding plate 1. In the light-transmissive sheet 4 layered at a predetermined position having part of its outer edge bonded to the light guiding plate 1, thermal deformation such as wrinkles due to temperature change is less likely to occur, so that the light-transmissive sheet 4 may be maintained in the planar shape on the light guiding plate 1. The light-transmissive sheet 4 may be layered at a predetermined position in the light guiding plate 1 having the entire outer edge or local portions bonded to the light guiding plate 1.

The light-transmissive sheet 4 is preferably a scattering sheet which is a light-transmissive resin sheet of PET or the like containing white-color powder such as titanium oxide powder as white-color powder. As shown in FIG. 4I, in the light emitting module 100 in which the light-cutting scattering layers 3 are disposed on the surface of the light guiding plate 1 facing the optical function parts 2 by using the scattering sheet, preferably the light-cutting scattering layers 3 are layered on the surface of the scattering sheet facing the light guiding plate 1. Thus, the light-cutting scattering layers 3 scatter thereby cutting light emitted from the light guiding plate 1, to thereby inhibit luminance concentration at the central part where each light emitting element 11. Additionally, the scattering sheet levels light emission before light exits from the light emitting module 100 to the outside. This may further effectively reduce luminance non-uniformity. The light-cutting scattering layers 3 may be formed of silicone resin containing titanium oxide powder by 60 weight percent or less, and have a thickness in a range of preferably 10 μm to 100 μm, more preferably 10 μm to 50 μm, and optimally about 20 μm.

The outline of each light-cutting scattering layer 3 is preferably greater than the outline of the corresponding optical function part 2 as seen in a plan view. The light-cutting scattering layer 3 greater than the flat part 1y of the corresponding optical function part 2 may scatter and cut the light transmitting through the optical function part 2, thereby inhibiting luminance concentration to reduce luminance non-uniformity.

The plurality of light emitting elements 11 may be wired so as to be driven independently of one another. Alternatively, the light guiding plate 1 may be divided into a plurality of ranges. A plurality of light emitting elements 11 mounted within one range is regarded as one group. The plurality of light emitting elements 11 belonging to the one group may electrically be connected in series or parallel to each other so as to be connected to an identical circuit, and a plurality of such light emitting element groups may be provided. Such grouping may provide a light emitting module with which local dimming may be realized.

Figure 6A:
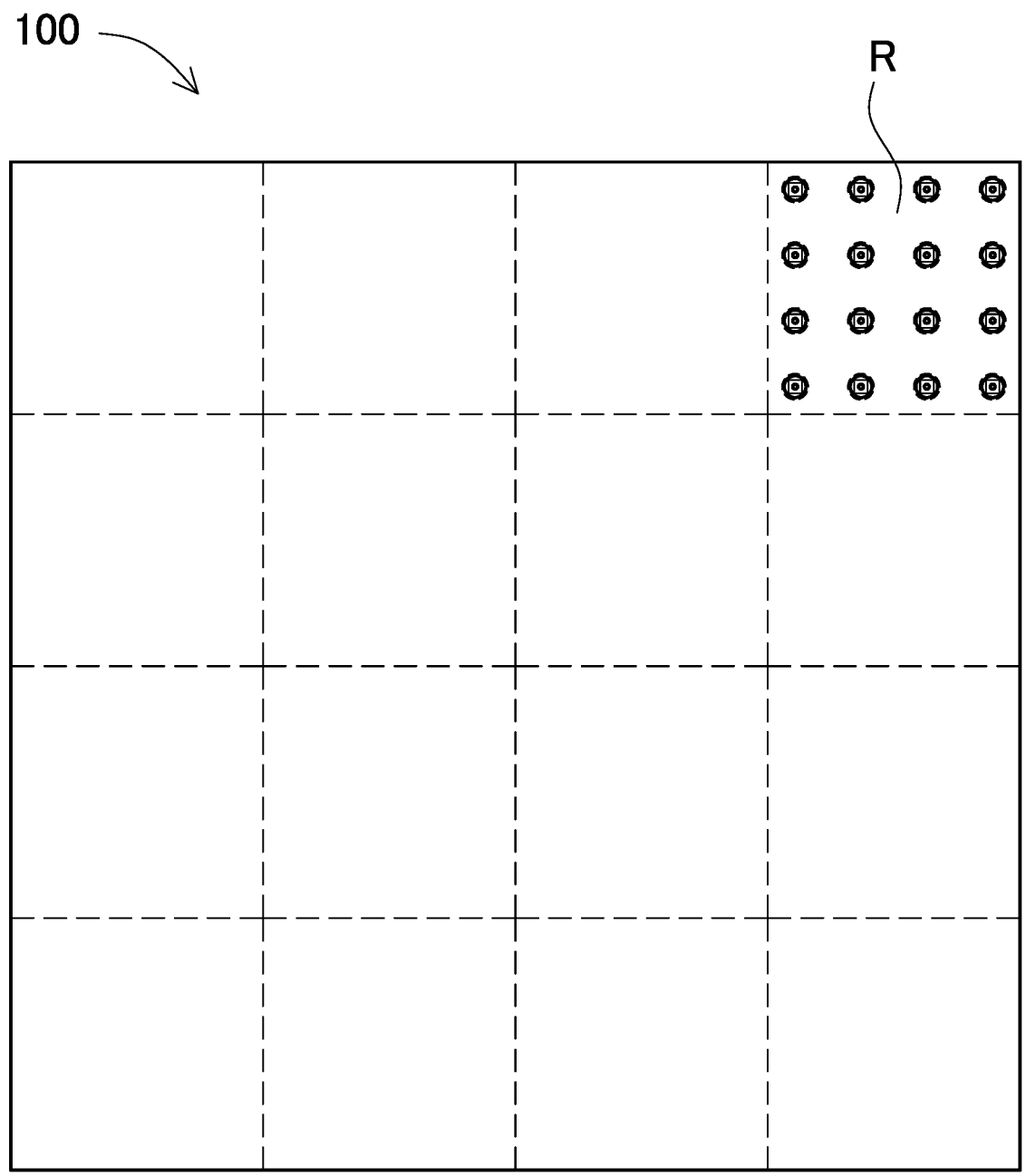
FIG. 6A is a schematic plan view of the light emitting module according to Embodiment 1 of the present disclosure.
Figure 6B:
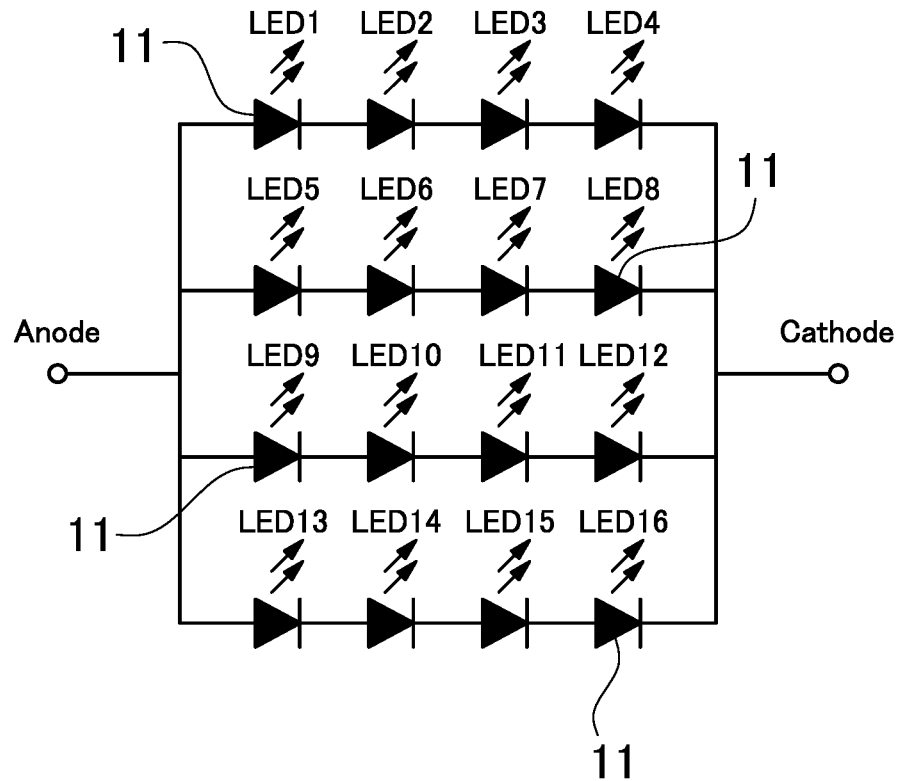
FIG. 6B is a circuit diagram of the light emitting module according to Embodiment 1 of the present disclosure.

FIGS. 6A and 6B exemplarily show such light emitting element groups. In this example, as shown in FIG. 6A, the light guiding plate 1 is divided into 16 pieces of regions R in 4 columns and 4 rows. In each region R, 16 pieces of light emitting elements are arranged in a 4-column and 4-row matrix. The 16 pieces of light emitting elements 11 are, for example, electrically connected to each other in a four-parallel and four-series circuit as shown in FIG. 6B.

The light emitting module 100 according to the present embodiment may be used as the backlight of one liquid crystal display device 3000. Alternatively, a plurality of light emitting modules 100 may be arranged, and used as the backlight of one liquid crystal display device 3000. When a plurality of small light emitting modules is prepared, and each subjected to inspection or the like, the yield may be improved as compared to a case in which a large light emitting module having a large number of light emitting devices mounted therein is prepared.

One light emitting module 100 may be bonded to one wiring board 20. Alternatively, a plurality of light emitting modules 100 may be bonded to one wiring board 20. Thus, electrical connection terminals for external connection (e.g., a connector 20e) may be unified, that is, the necessity of providing an electrical connection terminal for each light emitting module is eliminated. Accordingly, the liquid crystal display device 3000 in the simplified structure is provided.

A plurality of wiring boards 20 in each of which the plurality of light emitting modules 100 are bonded may be arranged, to serve as the backlight of one liquid crystal display device 3000. In such a case, for example, a plurality of wiring boards 20 may be mounted on a frame or the like, and connected to an external power supply using the connector 20e or the like.

Figure 7:
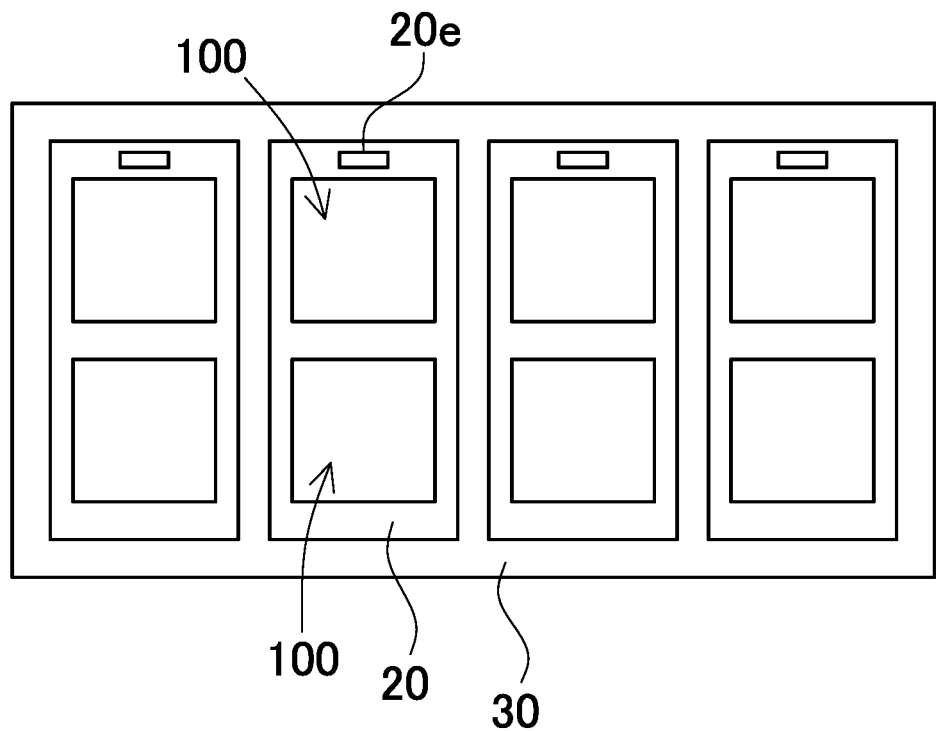
FIG. 7 is a schematic plan view of a liquid crystal display device in which the light emitting modules according to the Embodiment 1 of the present disclosure is installed.

FIG. 7 shows an exemplary liquid crystal display device including such a plurality of light emitting modules 100. In this example, what are mounted on a frame 30 are four wiring boards 20 to each of which two light emitting modules 100 are bonded and each provided with the connector 20e. That is, eight light emitting modules 100 are arranged by 2-row and 4-column. In this manner, the backlight of a large-area liquid crystal display device may be manufactured at lower costs.

A light-transmissive member having a diffusing function or the like may be further layered on the light guiding plate 1. In this case, when each optical function part 2 is a depression, the light-transmissive member is preferably provided so as to close the opening of the depression (that is, the portion near to the first main surface 1c of the light guiding plate 1) while avoiding filling the depression. Thus, an air layer may be provided in the depression of the optical function part 2, whereby light from each light emitting element 11 may spread well.

1-1. Variation 1 of Embodiment 1

Figure 8A:
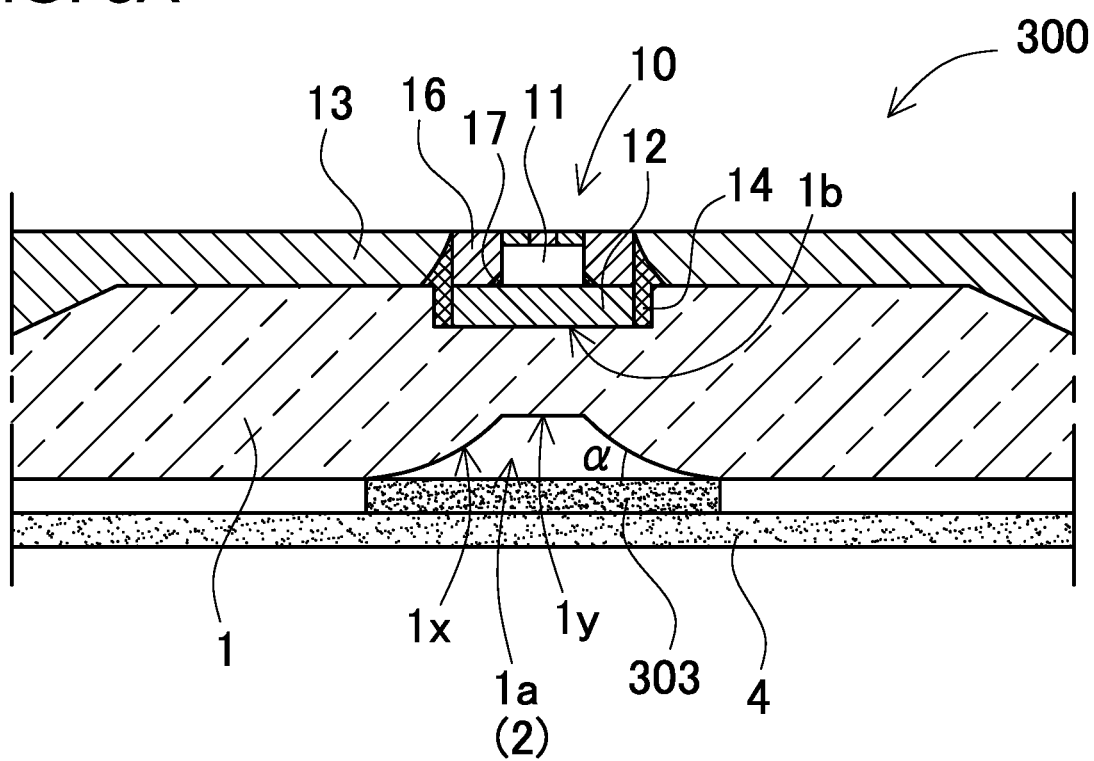
FIG. 8A is an enlarged schematic cross-sectional view of a light emitting module according to Variation 1 of Embodiment 1 of the present disclosure.
Figure 8B:
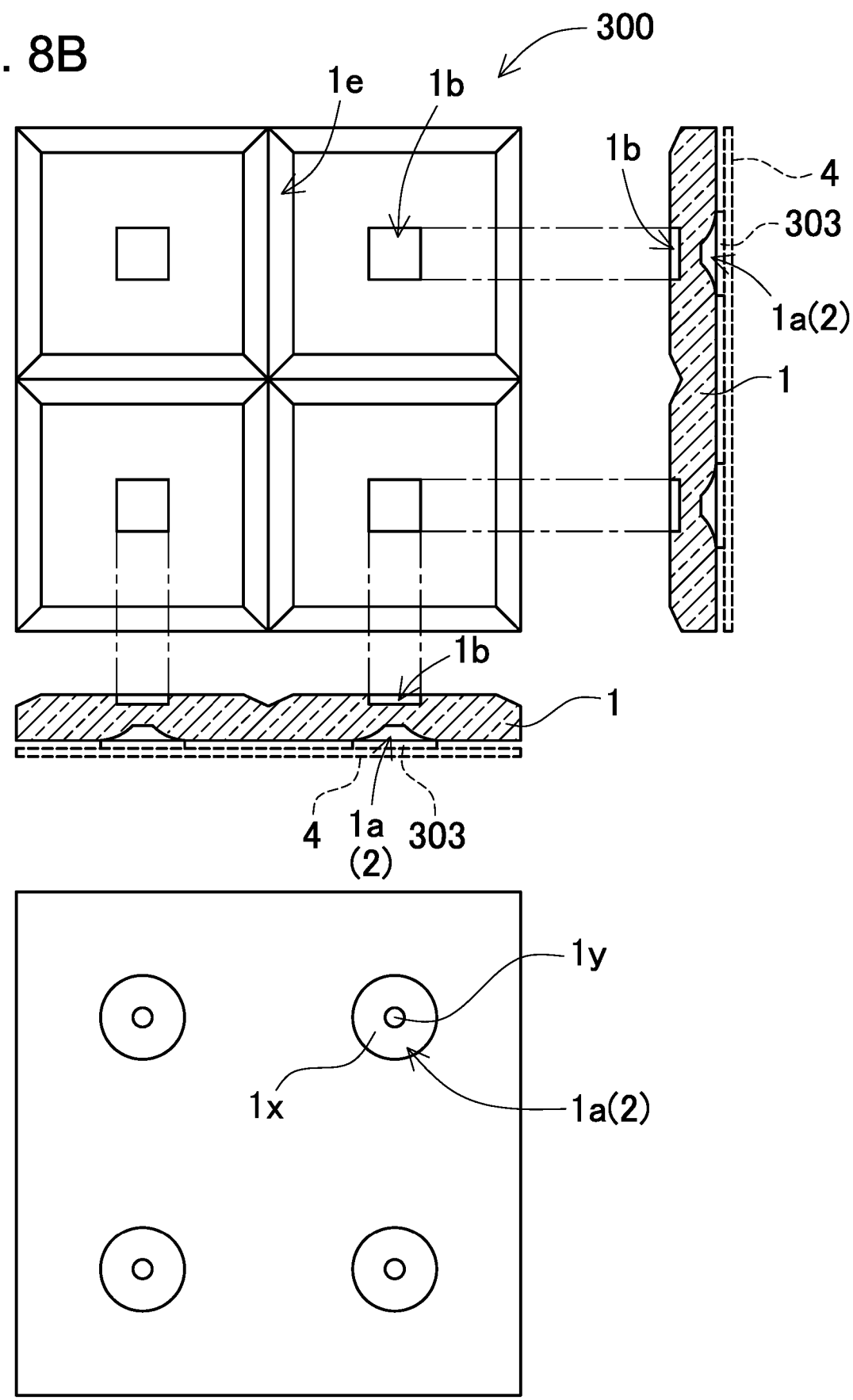
FIG. 8B is a top view, a cross-sectional view taken along a vertical line on the top view, a cross-sectional view taken along a lateral line on the top view, and a bottom view of an exemplary light guiding plate according to Variation 1 of Embodiment 1 of the present disclosure.

FIG. 8A is an enlarged cross-sectional view of a light emitting module 300 according to Variation 1. FIG. 8B is a top view, a cross-sectional view taken along a vertical line on the top view, a cross-sectional view taken along a lateral line on the top view, and a bottom view of the light guiding plate 1 in the light emitting module 300. In these drawings, a light-cutting scattering layer 303 covering the optical function part 2 has the outline which is substantially identical to the outline of the optical function part 2. In the light emitting module 300 according to Variation 1, the recess 1a of the optical function part 2 provided at the first main surface 1c has a shape of a frustum of a cone in which the inclination angle (a) of the inclined surface gradually becomes greater from the periphery toward the center. In the optical function part 2 having such a shape, because the outer edge of the inclined surface 1x is closer to the flat part of the first main surface 1c of the light guiding plate 1 in which the optical function part 2 is positioned, luminance concentration may be inhibited more as approaching to the outer edge of the optical function part 2. Accordingly, luminance non-uniformity may be reduced while the outline of the optical function part 2 is substantially the same as the outline of the light-cutting scattering layer 303.

1-2. Variation 2 of Embodiment 1

Figure 9A:
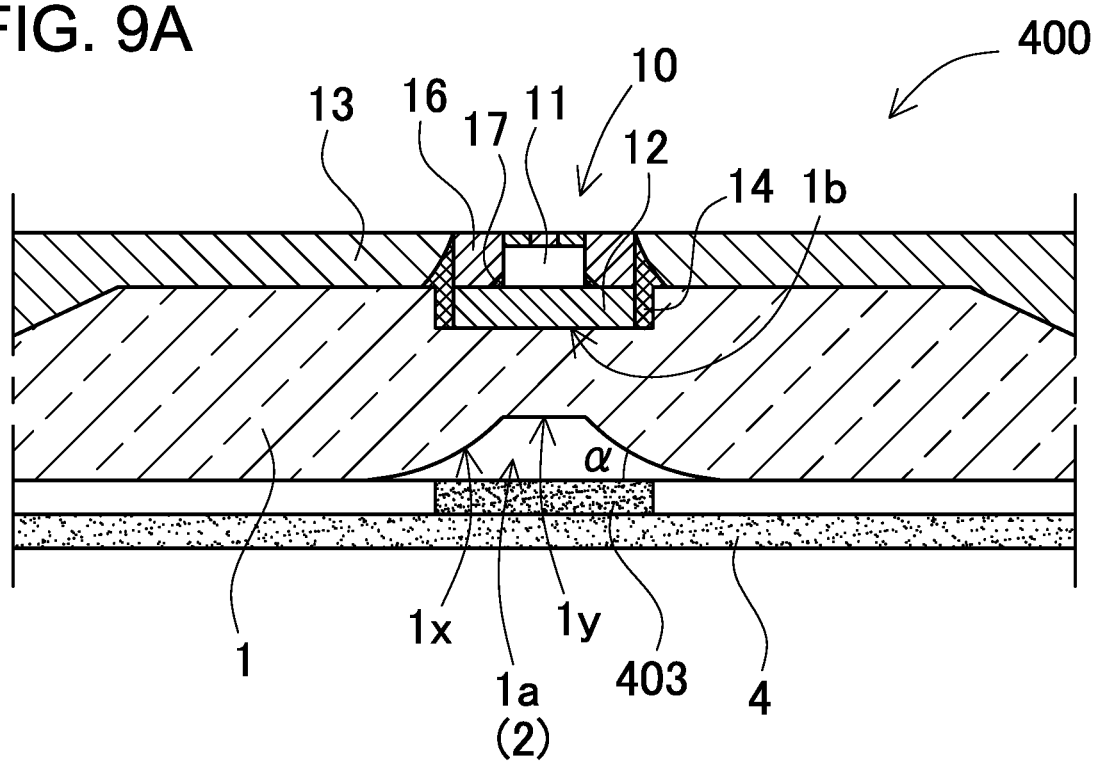
FIG. 9A is an enlarged schematic cross-sectional view of a light emitting module according to Variation 2 of Embodiment 1 of the present disclosure.
Figure 9B:
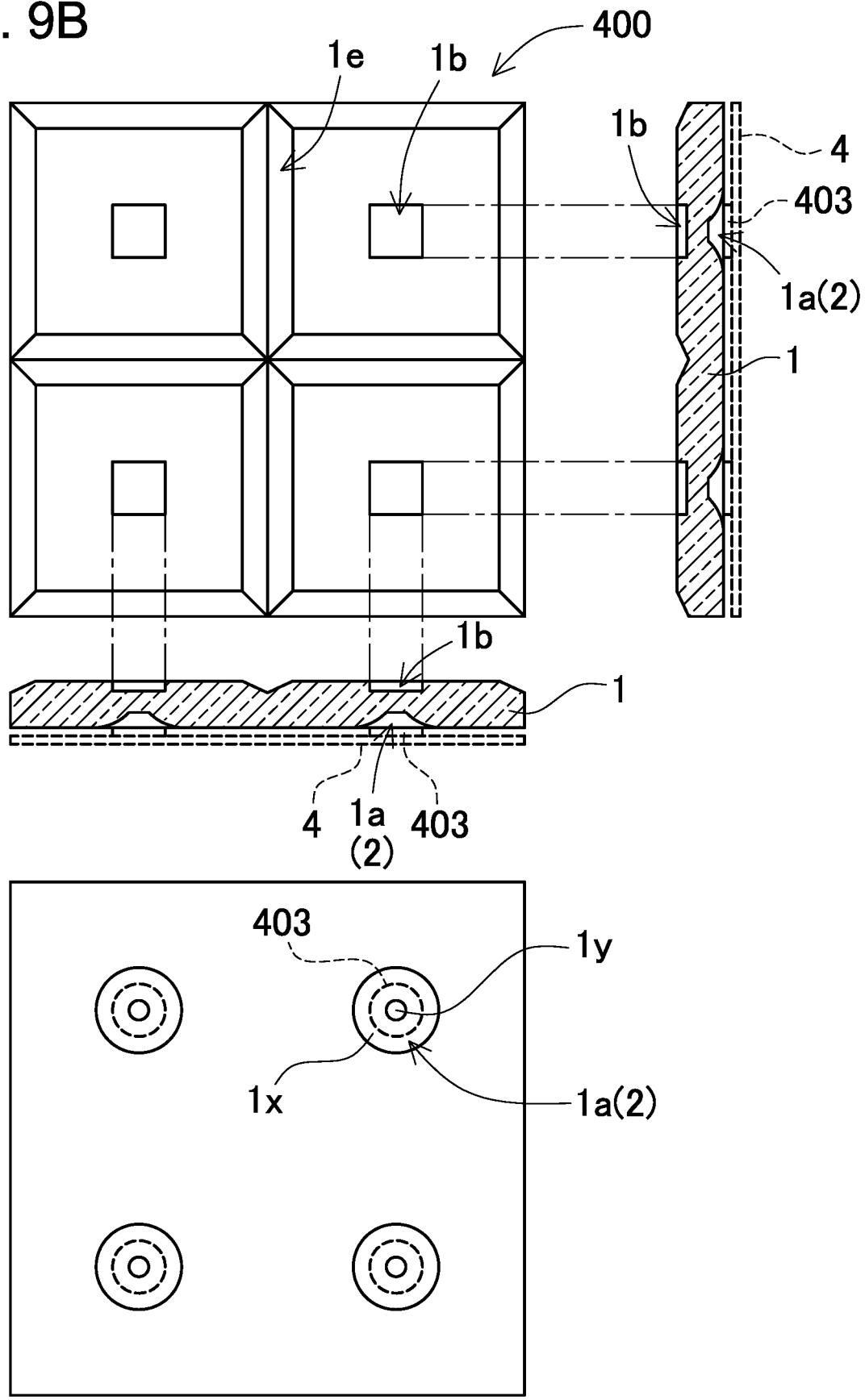
FIG. 9B is a top view, a cross-sectional view taken along a vertical line on the top view, a cross-sectional view taken along a lateral line on the top view, and a bottom view of an exemplary light guiding plate according to Variation 2 of Embodiment 1 of the present disclosure.

FIG. 9A is an enlarged cross-sectional view of a light emitting module 400 according to Variation 2. FIG. 9B is a top view, a cross-sectional view taken along a vertical line on the top view, a cross-sectional view taken along a lateral line on the top view, and a bottom view of the light guiding plate 1 used in the light emitting module 400. In Variation 2, the outline of a light-cutting scattering layer 403 is greater than the flat part 1$y$ of the optical function part 2 and smaller than the outline of the optical function part 2. The light-cutting scattering layer 403 having such a configuration may inhibit luminous concentration of light transmitted through the flat part 1$y$ of the optical function part 2, to thereby reduce luminance non-uniformity. With such a configuration, the flat part 1$y$ of the optical function part 2 may favorably resolve luminance non-uniformity attributed to misalignment between the optical function part 2 and the light emitting element 11 or the wavelength conversion part 12, and may favorably resolve luminous concentration by using the light-cutting scattering layer 403. Accordingly, luminance non-uniformity of the light emitting module 400 may be reduced.

1-3. Variation 3 of Embodiment 1

Figure 10A:
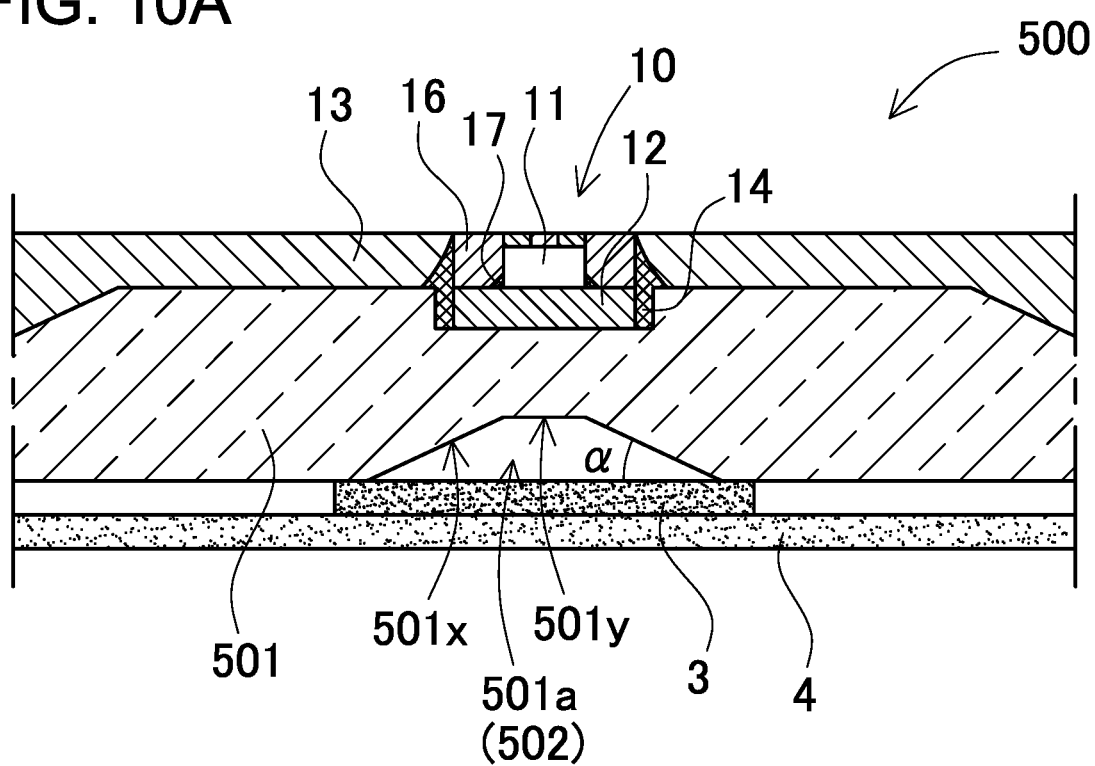
FIG. 10A is an enlarged schematic cross-sectional view of a light emitting module according to Variation 3 of Embodiment 1 of the present disclosure.
Figure 10B:
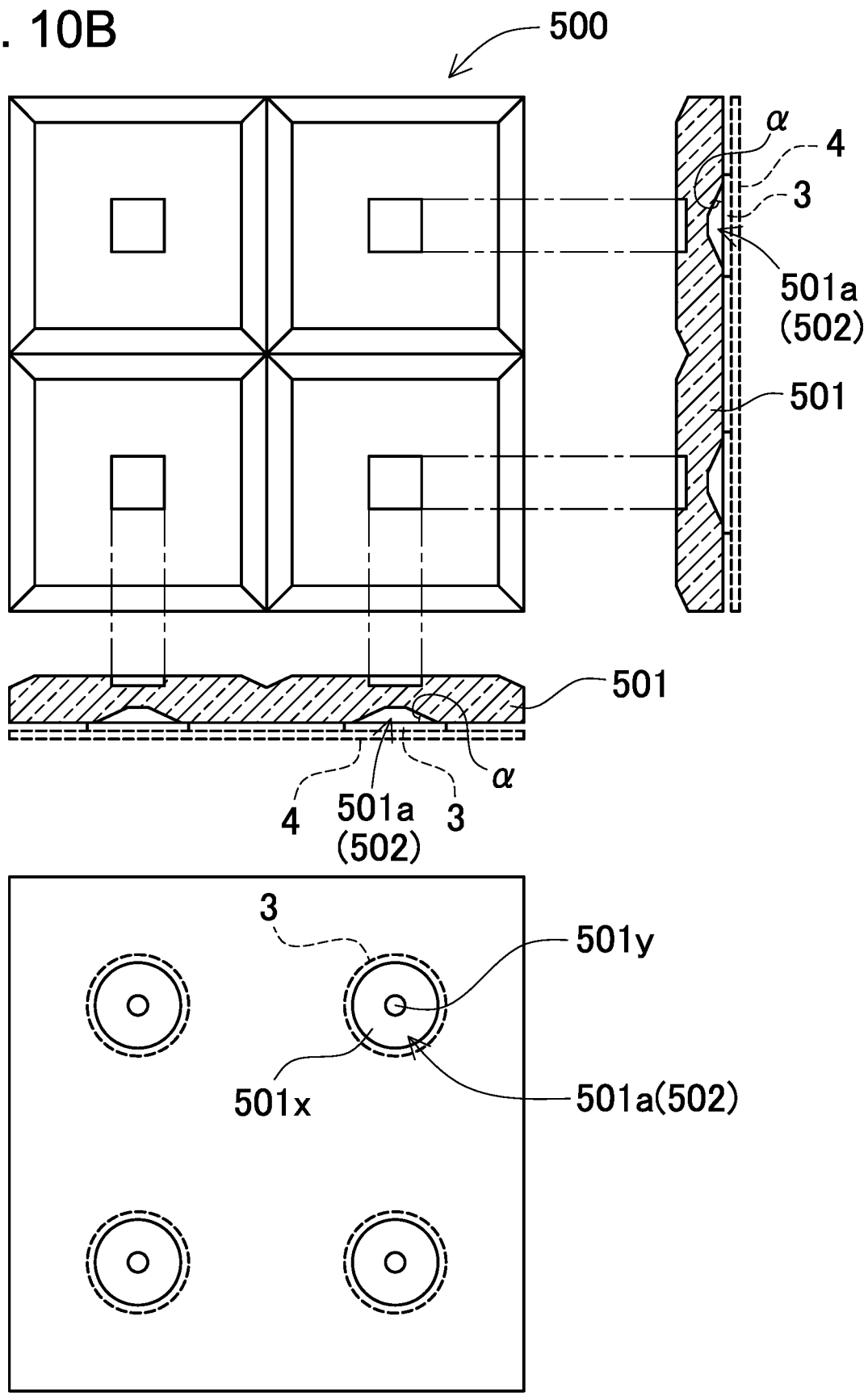
FIG. 10B is a top view, a cross-sectional view taken along a vertical line on the top view, a cross-sectional view taken along a lateral line on the top view, and a bottom view of an exemplary light guiding plate according to Variation 3 of Embodiment 1 of the present disclosure.

FIG. 10A is an enlarged cross-sectional view of a light emitting module 500 according to Variation 3. FIG. 10B is a tip view, a cross-sectional view taken along a vertical line on the top view, a cross-sectional view taken along a lateral line on the top view, and a bottom view of a light guiding plate 501 used in the light emitting module 500. In FIG. 10B, a recess 501$a$ of the optical function part 2 has a shape of a frustum of a cone in which the inclination angle (a) of an inclined surface 501$x$ is constant from the outer edge toward the central part, and a flat part 501$y$ is provided at the central part. The outline of the light-cutting scattering layer 3 is greater than the outline of the optical function part 2. In the light emitting module 500, luminance concentration of light transmitted through the optical function part 2 may be inhibited by using the light-cutting scattering layer 3 which is greater in size than the optical function part 2. This may reduce luminance non-uniformity. The light-cutting scattering layer 3 being greater in size than the optical function part 2 may also contribute to reducing luminance non-uniformity attributed to misalignment between the light-cutting scattering layer 3 and the optical function part 2.

1-4. Variation 4 of Embodiment 1

Figure 11A:
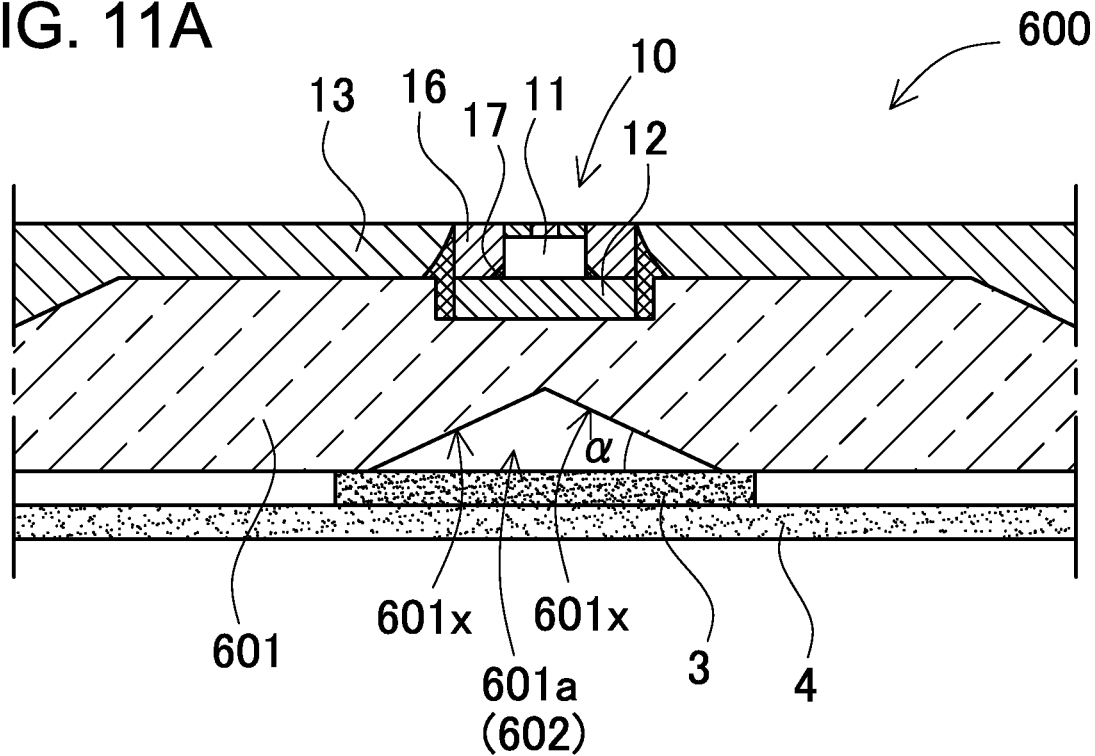
FIG. 11A is an enlarged schematic cross-sectional view of a light emitting module according to Variation 4 of Embodiment 1 of the present disclosure.
Figure 11B:
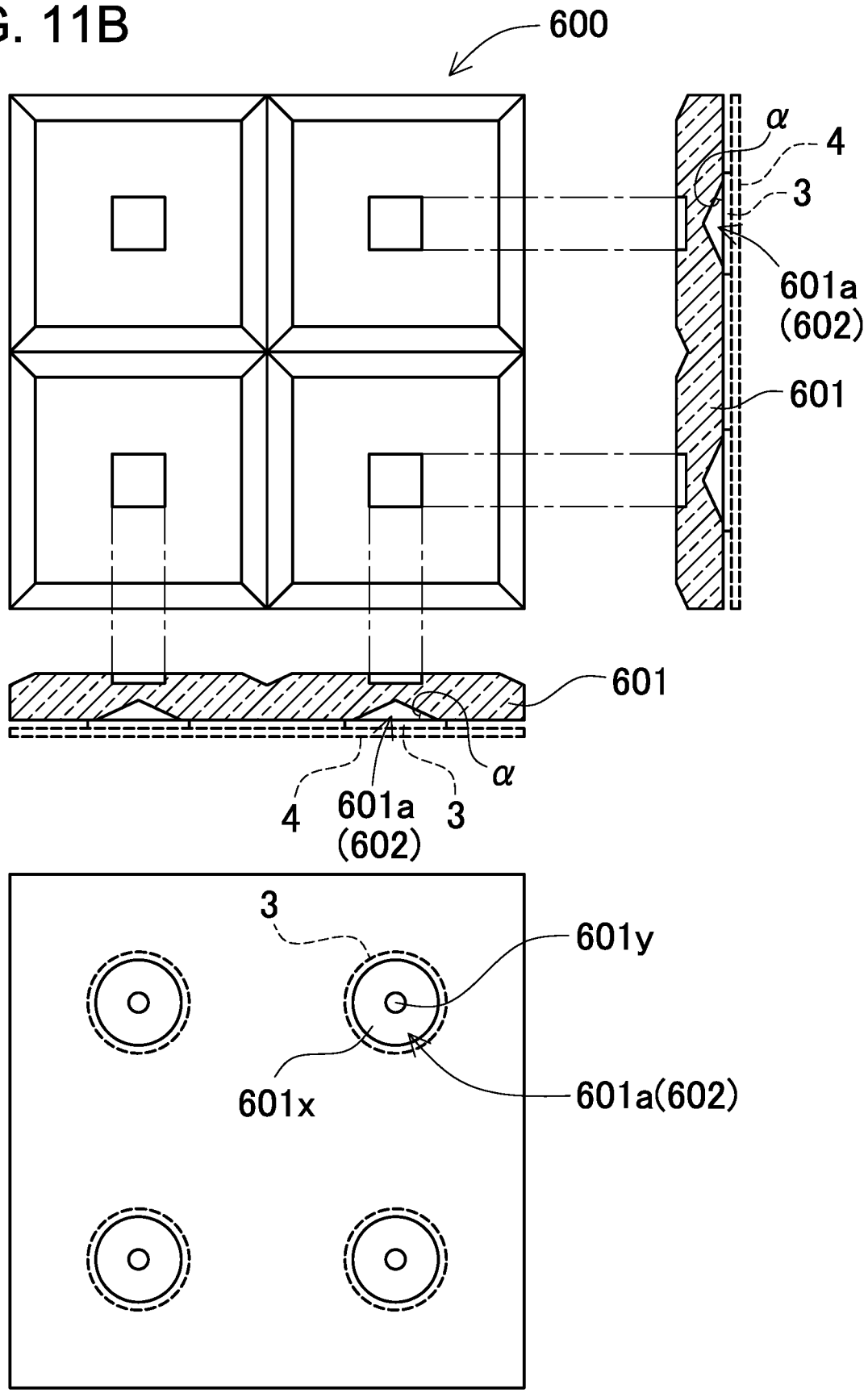
FIG. 11B is a top view, a cross-sectional view taken along a vertical line on the top view, a cross-sectional view taken along a lateral line on the top view, and a bottom view of an exemplary light guiding plate according to Variation 4 of Embodiment 1 of the present disclosure.

FIG. 11A is an enlarged cross-sectional view of a light emitting module 600 according to Variation 4. FIG. 11B is a top view, a cross-sectional view taken along a vertical line on the top view, a cross-sectional view taken along a lateral line on the top view, and a bottom view of a light guiding plate 601 used in the light emitting module 600. In FIG. 11A, a recess 601$a$ of the optical function part 2 is a conical shape in which the inclination angle (a) of an inclined surface 601$x$ is constant from the outer edge toward the central part, with no flat part at the central part. The outline of the light-cutting scattering layer 3 is greater than the outline of the optical function part 2. in the light emitting module 600, luminance concentration of light transmitted through the optical function part 2 may be inhibited by using the light-cutting scattering layer 3 which is greater in size than the optical function part 2. This may reduce luminance non-uniformity. The light-cutting scattering layer 3 being greater in size than the optical function part 2 may also contributes to reducing luminance non-uniformity attributed to misalignment between the light-cutting scattering layer 3 and the optical function part 2.

1-5. Variation 5 of Embodiment 1

Figure 12:
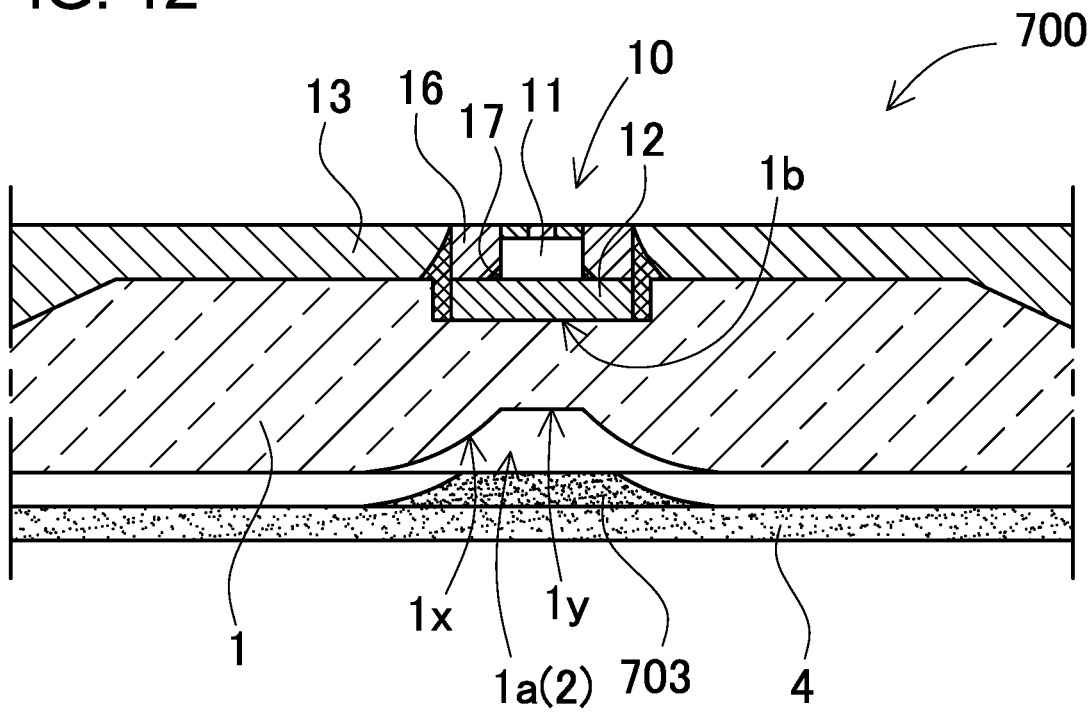
FIG. 12 is an enlarged schematic cross-sectional view of a light emitting module according to Variation 5 of Embodiment 1 of the present disclosure.

FIG. 12 is an enlarged cross-sectional view of a light emitting module 700 according to Variation 5. In the light emitting module 700 shown in FIG. 12, the recess 1$a$ of the optical function part 2 has a shape of a frustum of a cone having the flat part 1$y$ at the central part. At the opening of the recess 1$a$, a light-cutting scattering layer 703 of which transmittance is different at its central part and the outer edge. The thickness of the light-cutting scattering layer 703 is greater at the central part than the periphery, so that the transmittance is lower at the central part than the periphery. This may inhibit luminance concentration at the central part of the optical function part 2, to reduce luminance non-uniformity of the light emitting module 700. The light-cutting scattering layer 703 may be provided by applying pigment ink containing white-color powder onto the surface of the light-transmissive sheet 4 using a dot printer.

1-6. Variation 6 of Embodiment 1

Figure 13:
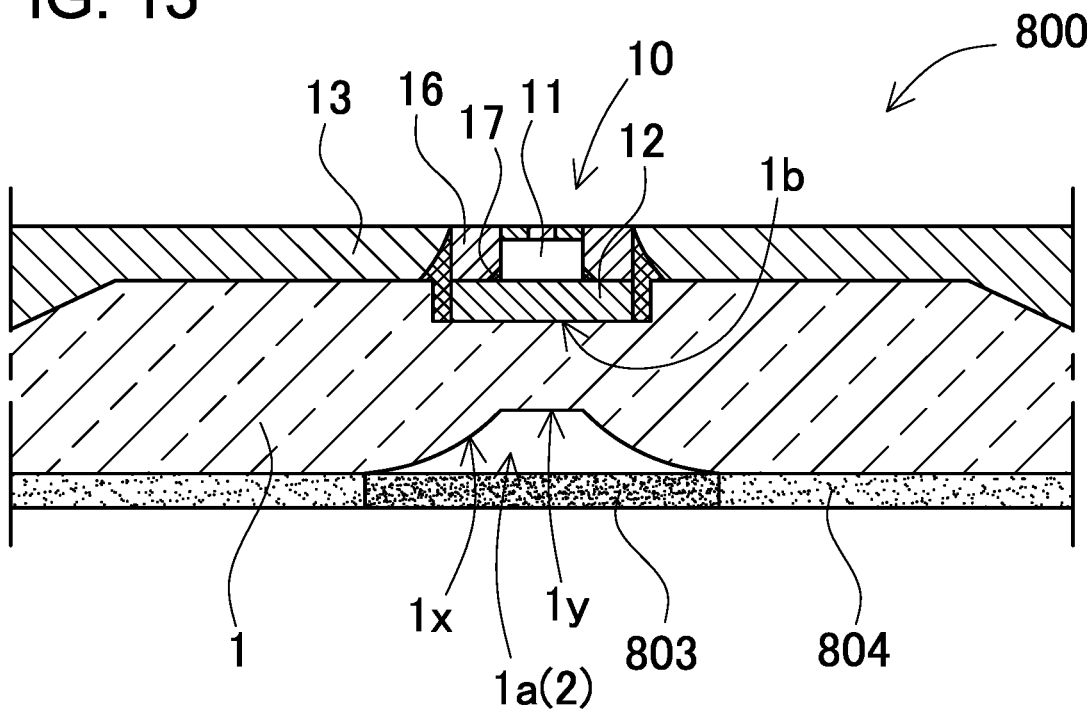
FIG. 13 is an enlarged schematic cross-sectional view of a light emitting module according to Variation 6 of Embodiment 1 of the present disclosure.

FIG. 13 is an enlarged cross-sectional view of a light emitting module 800 according to Variation 6. In the light emitting module 800 shown in FIG. 13, the recess 1$a$ of the optical function part 2 has a shape of a frustum of a cone having the flat part 1$y$ at the central part. A light-cutting scattering layer 803 integrated with a light-transmissive sheet 804 is disposed to cover the optical function part 2. In the light-transmissive sheet 804, the content ratio of white-color powder such as titanium oxide is greater in a region configuring the light-cutting scattering layer 803 than in a region configuring the light-transmissive sheet 804, so that the transmittance becomes lower in the region configuring the light-cutting scattering layer 803 than in the region configuring the light-transmissive sheet 804. Thus, the specific region in the light-transmissive sheet 804, that is, the region covering the optical function part 2 functions as the light-cutting scattering layer 803. In the light emitting module 800, the light-transmissive sheet 804 of which surface facing the light guiding plate 1 is flat is layered on the light guiding plate 1, and the light-cutting scattering layer 803 is provided to cover the optical function part 2.

1-7. Variation 7 of Embodiment 1

Figure 14:
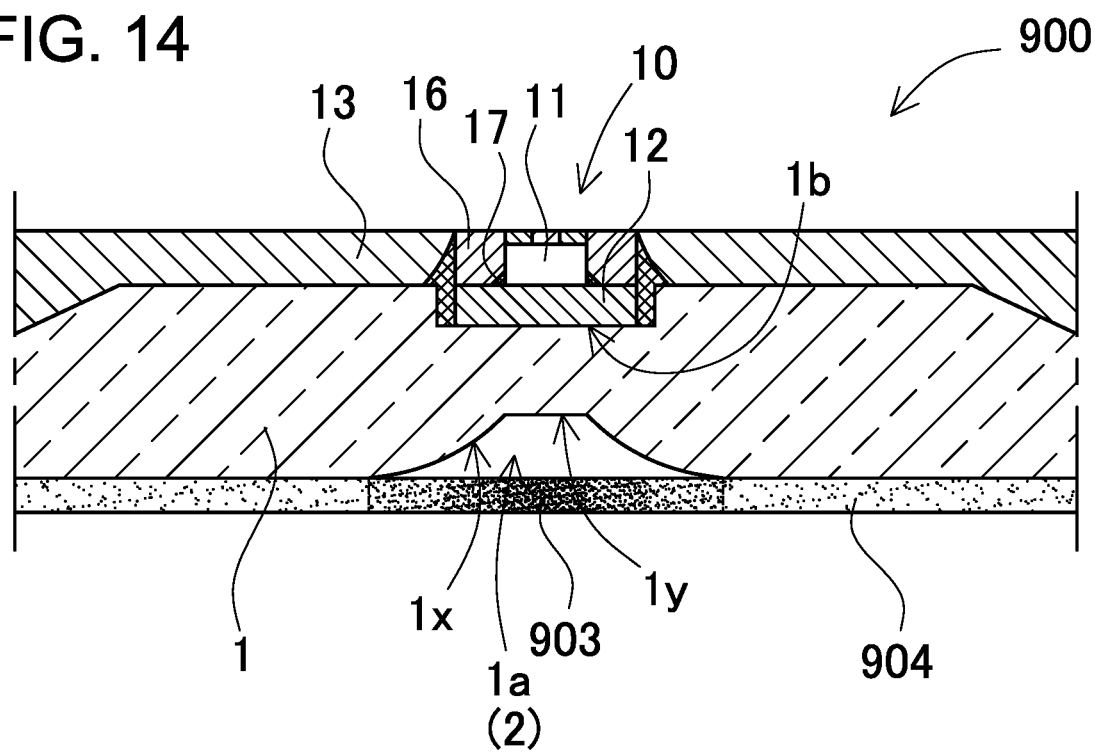
FIG. 14 is an enlarged schematic cross-sectional view of a light emitting module according to Variation 7 of Embodiment 1 of the present disclosure.

FIG. 14 is an enlarged cross-sectional view of a light emitting module 900 according to Variation 7. In the light emitting module 900 shown in FIG. 14, the recess 1$a$ of the optical function part 2 has a shape of a frustum of a cone having the flat part 1$y$ at the central part. A light-cutting scattering layer 903 integrated with a light-transmissive sheet 904 is disposed to cover the optical function part 2. In the light-transmissive sheet 904, the content rate of white-color powder such as titanium oxide is greater in a region configuring the light-cutting scattering layer 903 than in a region configuring the light-transmissive sheet 904, so that the transmittance becomes lower in the region configuring the light-cutting scattering layer 903 than in the region configuring the light-transmissive sheet 904. Thus, the light-cutting scattering layer 903 is provided in the specific region in the light-transmissive sheet 904. In the light-cutting scattering layer 903, the content rate of white-color powder is greater at the central part covering the flat part 1y than the periphery, so that the transmittance is lower at the central part than at the periphery. This can inhibit luminance concentration at the central part of the optical function part 2, and can favorably reduce luminance non-uniformity.

Embodiment 2

Figure 15A:
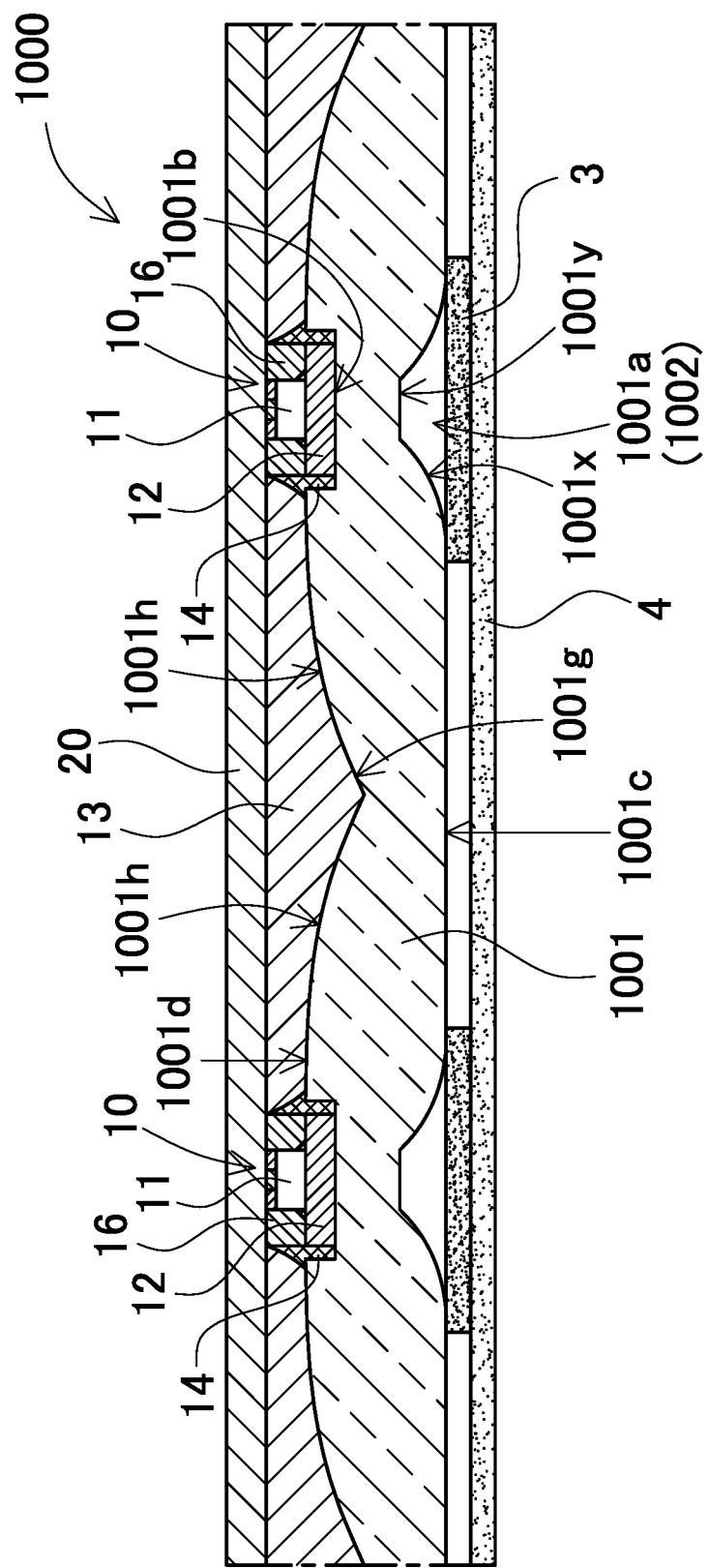
FIG. 15A is a schematic cross-sectional view of a light emitting module according to Embodiment 2 of the present disclosure.
Figure 15B:
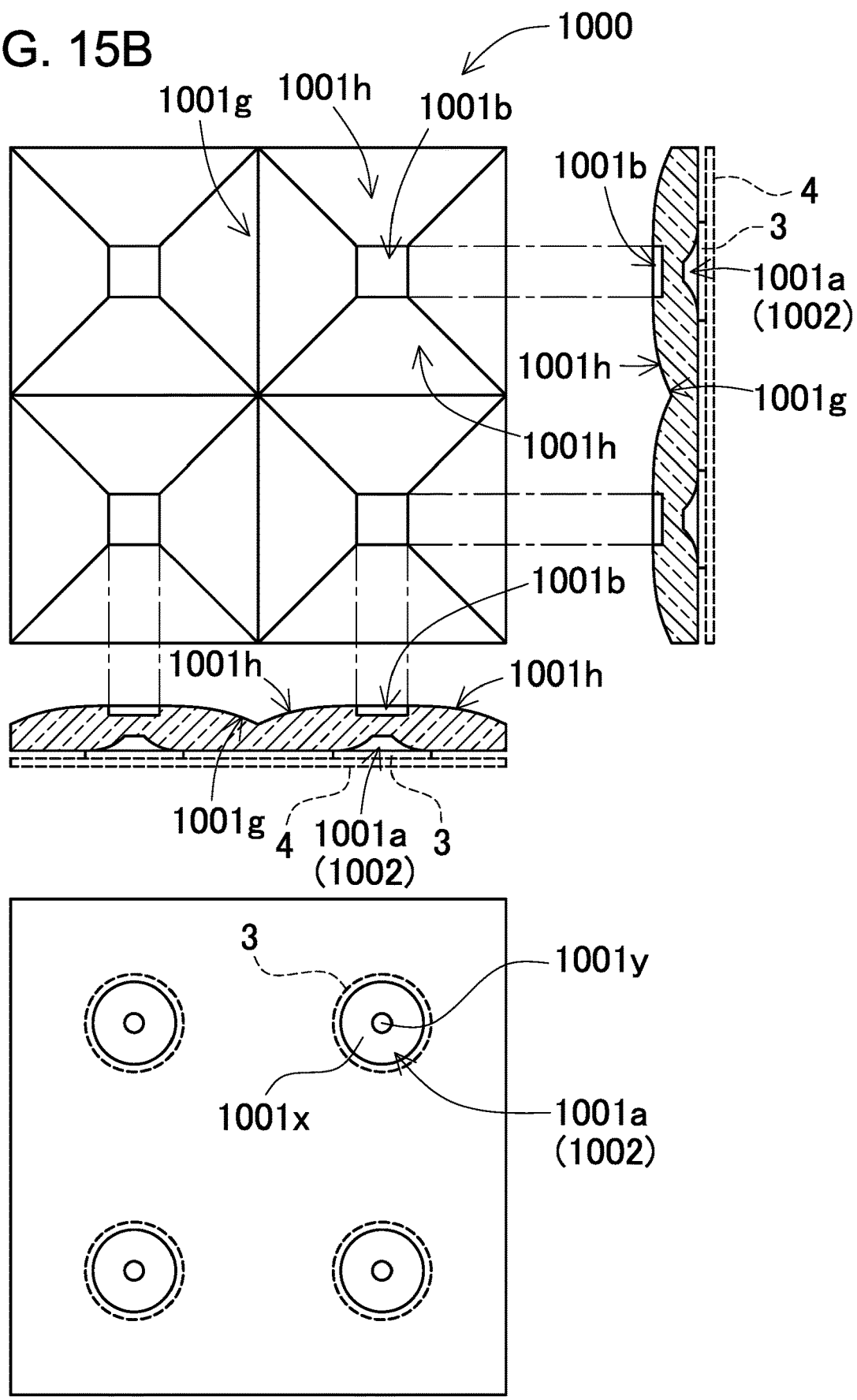
FIG. 15B is a top view, a cross-sectional view taken along a vertical line on the top view, a cross-sectional view taken along a lateral line on the top view, and a bottom view of an exemplary light guiding plate according to Embodiment 2 of the present disclosure.

FIG. 15A is an enlarged cross-sectional view of a light emitting module 1000 according to a Embodiment 2. FIG. 15B is a top view, a cross-sectional view taken along a vertical line on the top view, a cross-sectional view taken along a lateral line on the top view, and a bottom view of a light guiding plate 1001 used in the light emitting module 1000. The light guiding plate 1001 of the light emitting module 1000 according to the Embodiment 2 has a second main surface 1001d on which light-reflective recesses 1001g is formed. The light-reflective recesses 1001g each have light-reflective surfaces 1001h oriented toward the corresponding light emitting elements 11 and reflect light from the light emitting elements 11. The light-reflective surfaces 1001h are curved surfaces deepest at substantially the intermediate position between two recesses 1001b. The Embodiment 2 exemplary show the entire second main surface 1001d excluding the recesses 1001b are curved surfaces. Thus, light from the light emitting elements 11 is efficiently reflected. Alternatively, the second main surface 1001d may have a flat surface. In FIG. 15A, the depth of the light-reflective recesses 1001g is deeper than the recesses 1001b. This structure may efficiently reflect light from the light emitting elements 11 and achieves planar light emission evenly emitting light.

In the light emitting module 1000 shown in FIG. 15A, the recess 1001a of each optical function part 1002 has a shape of a frustum of a cone having the flat part 1001y at the central part, in which the inclination angle (a) of an inclined surface 1001x gradually becomes greater from the outer edge toward the center. In the light emitting module 1000, the outline of each light-cutting scattering layer 3 is greater than the outline of the corresponding optical function part 1002. This can reduce luminance non-uniformity attributed to misalignment between the optical function part 1002 and the light-cutting scattering layer 3. In the light emitting module 1000, luminance concentration of light transmitted through the optical function part 1002 can be inhibited by using the light-cutting scattering layer 3 being greater in size than the optical function part 1002, to thereby reduce luminance non-uniformity.

Embodiment 3

Figure 16A:
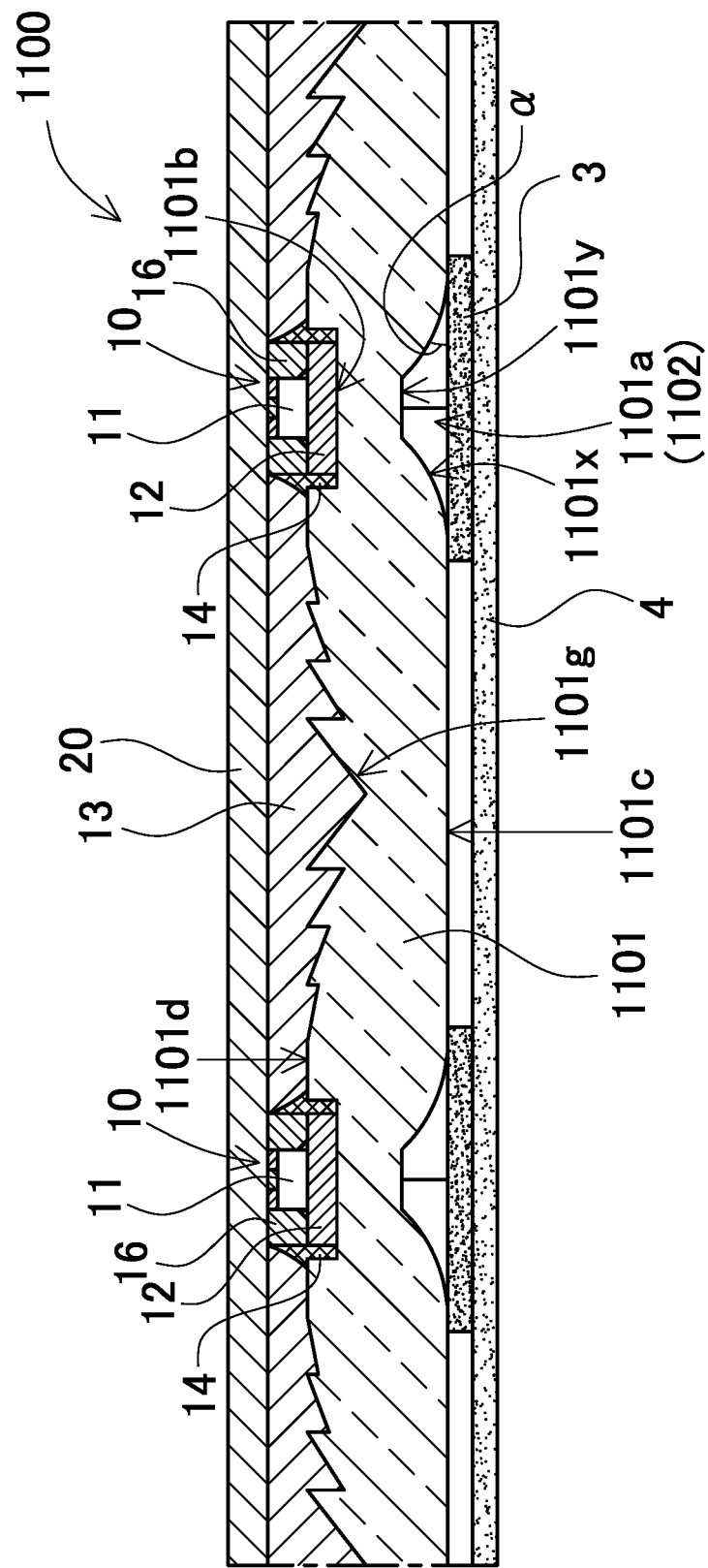
FIG. 16A is a schematic cross-sectional view of a light emitting module according to Embodiment 3 of the present disclosure.
Figure 16B:
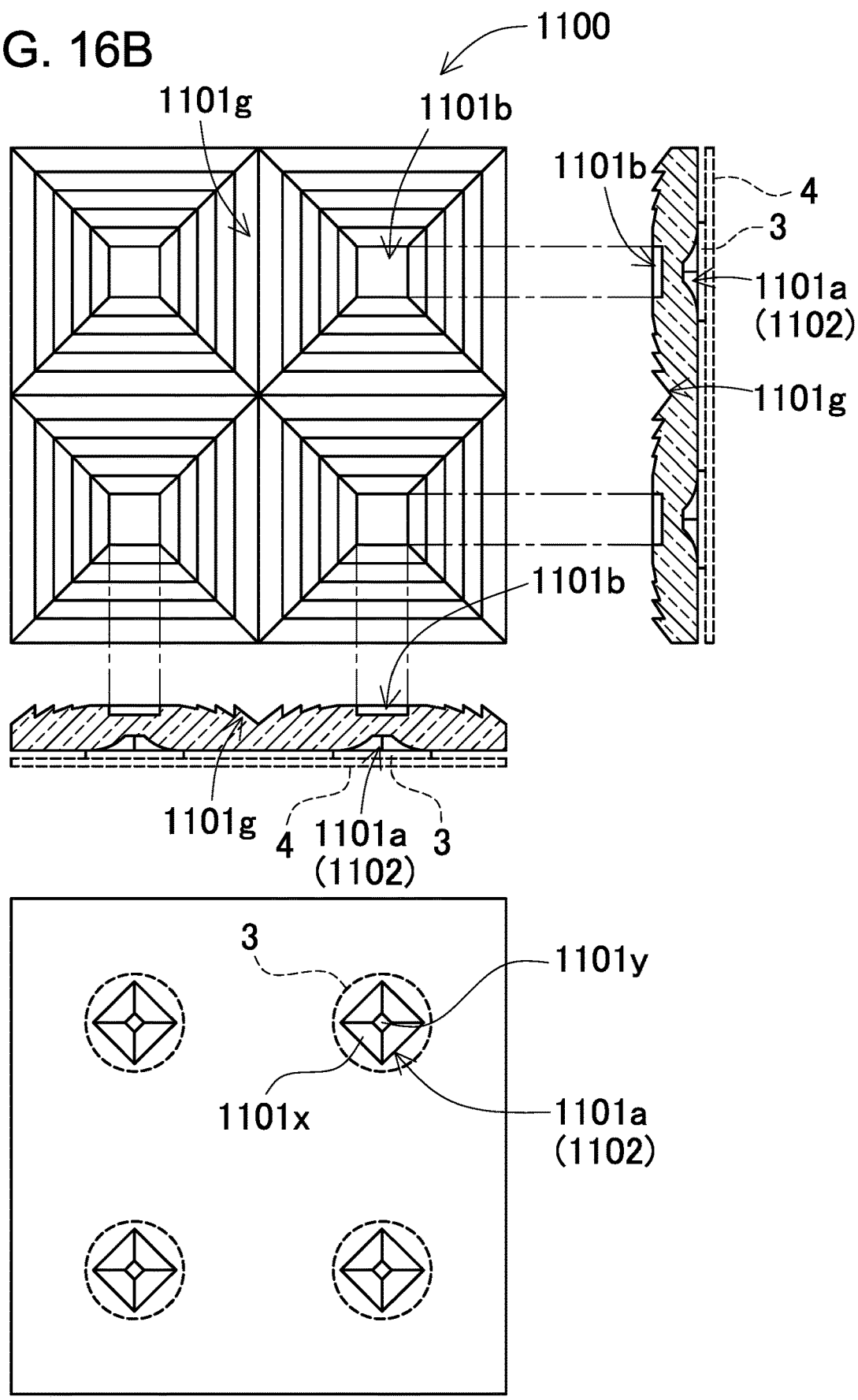
FIG. 16B is a top view, a cross-sectional view taken along a vertical line on the top view, a cross-sectional view taken along a lateral line on the top view, and a bottom view of an exemplary light guiding plate according to Embodiment 3 of the present disclosure.
Figure 16C:
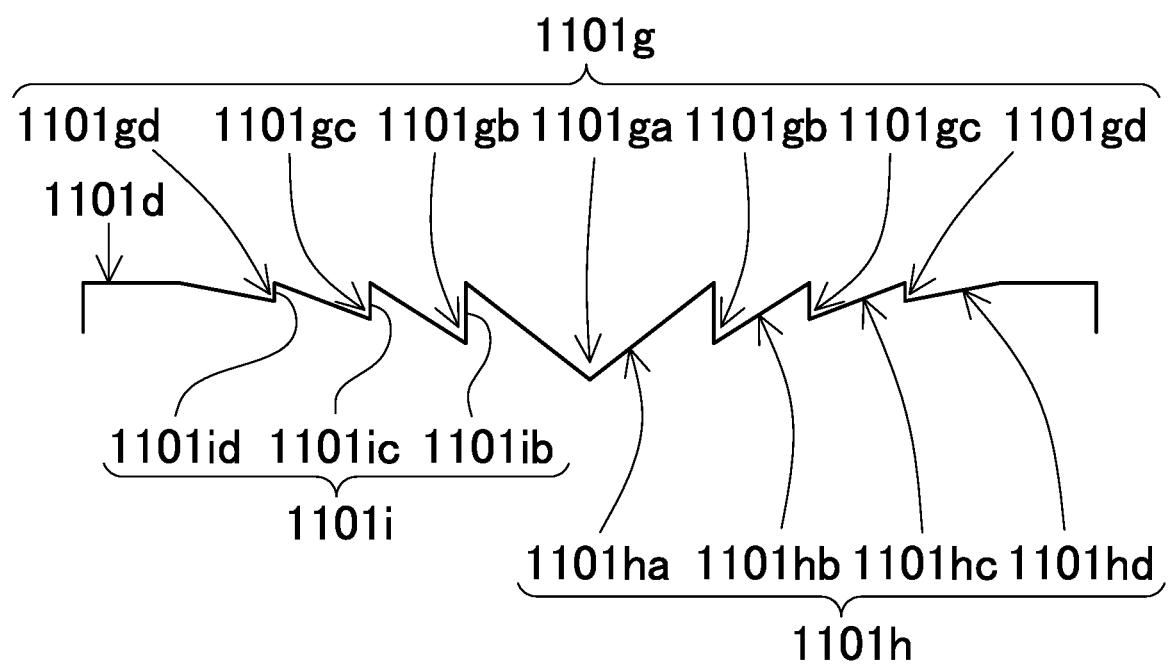
FIG. 16C is an enlarged cross-sectional view of a main part of the light guiding plate in the light emitting module shown in FIG. 16A.

FIG. 16A is an enlarged cross-sectional view of a light emitting module 1100 according to a Embodiment 3. FIG. 16B is a plan view, a cross-sectional view taken along a vertical line on the top view, a cross-sectional view taken along a lateral line on the top view, and a bottom view of a light guiding plate 1101 used in the light emitting module 1100. FIG. 16C is an enlarged view of a region in the light guiding plate 1101 demarcated by broken line in FIG. 16A. The light guiding plate 1101 of the light emitting module 1100 according to the Embodiment 3 includes an optical function part 1102 for each light emitting element 11, and a plurality of light-reflective recesses 1101g for each light emitting element 11. The light-reflective recesses 1101g include light-reflective surfaces 1101h oriented toward the corresponding light emitting elements 11 and reflect light from the light emitting elements 11. The present embodiment exemplarily shows the light guiding plate 1101 including four parts of light-reflective recesses, namely, first to fourth light-reflective recesses 1101g. There is no requirement for the number of the light-reflective recesses 1101g, and may be provided at least two. In the light-reflective recesses 1101g, the encapsulating member 13 may be provided.

As shown in FIG. 16B, the first light-reflective recess 1101ga of which depth from the second main surface 1101d is the deepest is provided at the intermediate position between two recesses 1101b of the light guiding plate 1101. The first light-reflective recess 1101ga is provided in a quadrangular manner as seen in a top view so as to surround the recess 1101b. The second light-reflective recess 1101gb is provided inward of the first light-reflective recess 1101ga in a top view. The third light-reflective recess 1101gc is provided inward of the second light-reflective recess 1101gb in a top view. The fourth light-reflective recess 1101gd is provided inward or the third light-reflective recess 1101gc in a top view and closest to the light emitting element 11. The first to fourth light-reflective recesses respectively have light-reflective surfaces 1101ha, 1101hb, 1101hc, 1101hd oriented toward the corresponding light emitting element 11, and reflect light from light emitting element 11 toward the first main surface 1101c of the light guiding plate 1101. The first light-reflective recess 1101ga has two light-reflective surfaces 1101ha to reflect light from two light emitting elements 11 which sandwich the first light-reflective recess 1101ga. The second to fourth light-reflective recesses respectively have auxiliary light-reflective surfaces 1101ib, 1101ic, 1101id positioned at the far side from the light emitting element 11. These auxiliary light-reflective surfaces 1101i reflect light reflected at the light-reflective surfaces 1101h respectively facing auxiliary light-reflective surfaces 1101i.

The first light-reflective recess 1101ga positioned farthest from the light emitting element 11 is greater in depth than the second light-reflective recess 1101gb positioned inward thereof. Thus, the first light-reflective recess 1101ga can reflect light not blocked by the light-reflective surfaces of the second to fourth light-reflective recesses among light from the light emitting element 11. With such light-reflective recesses 1101g nearer to the light emitting element 11 being smaller in depth, respective light-reflective surfaces 1101h of the light-reflective recesses 1101g can effectively be used. The first light-reflective recess 1101ga is preferably greater in depth than the recess 1101b. This structure can efficiently reflect light from the light emitting element 11 to achieve planar light emission evenly emitting light.

The angles of respective light-reflective surfaces 1101h of the light-reflective recesses 1101g may be designed taking into consideration of various factors including the purpose, the intended use, the light distribution characteristics of the light emitting elements 11, the thickness of the light guiding plate 1101 and the like. As an example, the light guiding plate 1101 may be formed using polycarbonate and has a thickness of 1.1 mm. The recess 1101b as seen in a plan view is a square in a size of 0.5 mm×0.5 mm and of which depth is 0.1 mm. The distance between adjacent recesses 1101b is 0.8 mm.

The first light-reflective recess 1101ga has a thickness of 0.80 mm, and the light-reflective surface 1101ha is inclined by 16 degrees with reference to the second main surface 1101d. The second light-reflective recess 1101gb has a thickness of 0.50 mm, and the light-reflective surface 1101hb is inclined by 32 degrees with reference to the second main surface 1101d. The third light-reflective recess 1101gc has a thickness of 0.31 mm, and the light-reflective surface 1101hc is inclined by 45 degrees with reference to the second main surface 1101d. The fourth light-reflective recess 1101gd has a thickness of 0.15 mm, and the light-reflective surface 1101hd is inclined by 58 degrees with reference to the second main surface 1101d.

In the light emitting module 1100 shown in FIG. 16A, the recess 1101a of each optical function part 1102 includes a quadrangular opening. The inclination angle (a) of the inclined surface 1101x of the recess 1101a becomes gradually greater from the periphery toward the center. The recess 1101a has a shape of a frustum of a pyramid in which a flat part 1101y is provided at the central part. The corners of the quadrangular opening and the corners of the light source including the light emitting element 11 are displaced from each other by 45 degrees about the optical axis. In the light emitting module 1100, the outline of the light-cutting scattering layer 3 is greater than the outline of the optical function part 1102. This can reduce luminance non-uniformity attributed to misalignment between the optical function part 1102 and the light-cutting scattering layer 3. In the light emitting module 1100, luminance concentration of light transmitted through the optical function part 1102 can be inhibited by using the light-cutting scattering layer 3 being greater in size than the optical function part 1102, to thereby reduce luminance non-uniformity.

Embodiment 4

Figure 17:
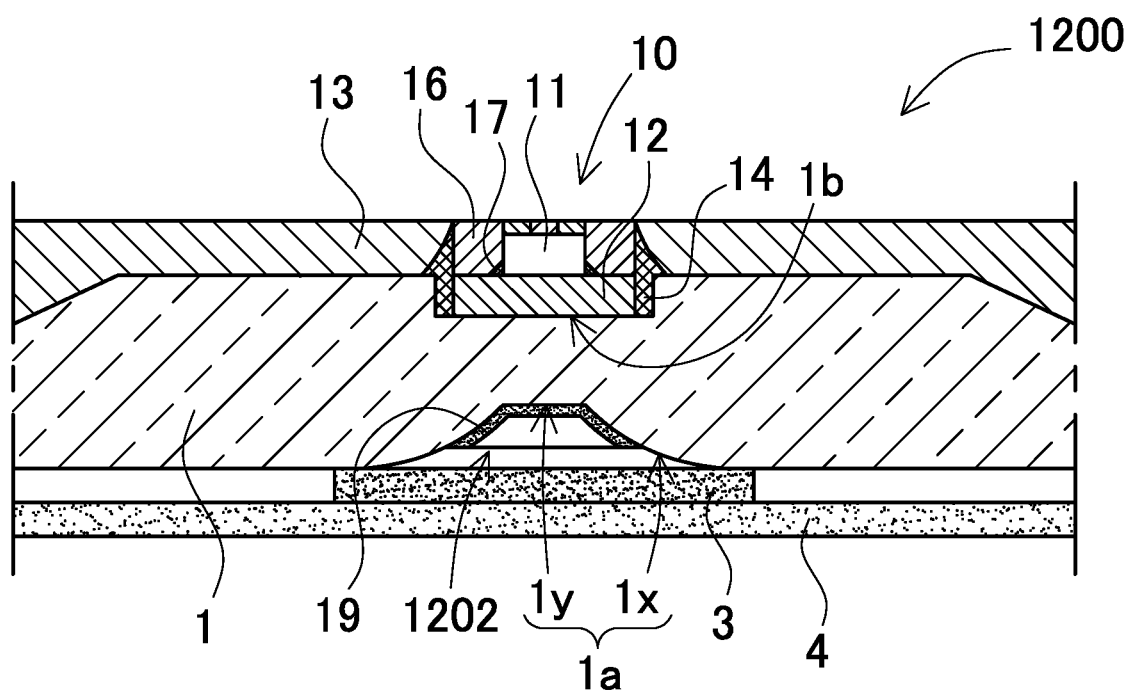
FIG. 17 is a schematic cross-sectional view of a light emitting module according to Embodiment 4 of the present disclosure.

FIG. 17 is an enlarged cross-sectional view of a light emitting module 1200 according to a Embodiment 4. In the light emitting module 1200 shown in FIG. 17, an optical function part 1202 includes a light-reflective layer 19 formed using a light-reflective material at the surface of the recess 1a of the light guiding plate 1. The light-reflective material may be configured as, for example, white-color resin. In the optical function part 1202 shown in FIG. 17, the light-reflective material is provided by a predetermined thickness on a portion of the surface in the recess 1a provided at the light guiding plate 1 and at a region from the central part of the inclined surface 1x to the flat part 1y (the upper side of the recess 1a in FIG. 17), to serve as the light-reflective layer 19. The light-reflective layer may be provided at the entire recess or only at the flat part. Although the light-reflective layer in the drawing has an entirely even thickness, the thickness may be increased gradually from the outer edge toward the central part in the recess. For example, the light-reflective layer may have a constant thickness at the region facing the flat part, and the thickness may be gradually reduced toward the outer edge in the region facing the inclined surface.

Thus, by virtue of synergy between the light-reflective layer 19 at the central part of the optical function part 1202 and the light-cutting scattering layer 3 covering the optical function part 1202, the light emitting module 1200 in which the recesses 1a are each provided with the light-reflective layer 19 may further inhibit luminous concentration at the central part to thereby reduce luminance non-uniformity.

In the foregoing, the embodiments of the present disclosure are exemplarily provided. It goes without saying that the present disclosure is not limited to the above-described embodiments, and may be practiced in any manner within the spirit of the present disclosure.

The disclosure of the present specification may include the following modes.

Mode 1

A light emitting module including:
- a light guiding plate being light-transmissive and having a first main surface being a light emitting surface from which light exit to outside, and a second main surface positioned opposite to the first main surface;
- a light emitting element disposed at the second main surface of the light guiding plate and configured to emit light toward the light guiding plate;
- an optical function part being greater in size than a light emitting surface of the light emitting element, the optical function part being disposed in the first main surface of the light guiding plate so as to correspond to an optical axis of the light emitting element; and
- a light-cutting scattering layer disposed on a first main surface side of the light guiding plate so as to correspond to the optical axis of the light emitting element.

The light-cutting scattering layer covers the optical function part as seen in a plan view.

Mode 2

In the light emitting module according to mode 1, further comprising at least one additional light emitting element. A partitioning recess is provided at the second main surface of the light guiding plate while being between adjacent ones of the light emitting elements, and the partitioning recess has a plurality of inclined surfaces continuous to the second main surface. An outline of the optical function part is smaller than a region surrounded by the partitioning recess as seen in a plan view.

Mode 3

The light emitting module according to mode 1 or 2 further comprising a wavelength conversion part disposed between the light emitting element and the light guiding plate and configured to convert a wavelength of light from the light emitting element and allow the light to become incident on the light guiding plate. An outline of the optical function part is greater than an outline of the wavelength conversion part as seen in a plan view.

Mode 4

In the light emitting module according to any one of modes 1 to 3, the optical function part is configured as a recess. The optical function part has an inner surface having an inclined surface becoming closer to the center of the recess as approaching closer to the light emitting element.

Mode 5

In the light emitting module according to mode 4, an inclination angle of the inclined surface of the optical function part becomes gradually greater toward the central part of the optical function part.

Mode 6

In the light emitting module according to mode 4 or 5, the optical function part has a flat part at its bottom part.

Mode 7

In the light emitting module according to mode 6, the flat part of the optical function part is positioned on the optical axis of the light emitting element.

Mode 8

The light emitting module according to any one of modes 1 to 7 further includes a light-transmissive sheet layered on a first main surface of the light guiding plate. The light-cutting scattering layer is provided at the light-transmissive sheet.

Mode 9

In the light emitting module according to mode 8, the light-transmissive sheet is a light-scattering sheet configured to scatter and transmit light.

Mode 10

In the light emitting module according to mode 9, the light-cutting scattering layer is bonded to a surface of the light-transmissive sheet so as to the surface of the light-transmissive sheet faces the light guiding plate.

Mode 11

In the light emitting module according to mode 6 or 7, an outline of the light-cutting scattering layer is greater than an outline of the flat part of the optical function part as seen in a plan view.

Mode 12

In the light emitting module according to any one of modes 1 to 11, the outline of the light-cutting scattering layer is greater than the outline of the optical function part as seen in a plan view.

The light emitting module of the present disclosure is applicable to, for example, backlight of a liquid crystal display device.

It should be apparent to those with an ordinary skill in the art that while various preferred embodiments of the invention have been shown and described, the invention is not limited to the particular embodiments disclosed, which are deemed to be merely illustrative of the inventive concepts, and which are suitable for all modifications and changes falling within the scope of the invention as defined in the appended claims.

What is claimed is:
1. A light emitting module comprising:
a plurality of light emitting elements, each having a pair of electrodes, a lateral surface and a light emitting surface;
a plurality of light-reflective members, each having a first surface and a second surface opposite to the first surface, each light-reflective member surrounding the lateral surface of each light emitting element;
a light guide covering the light emitting surface of each light emitting element and the first surface of each light-reflective member, the light guide having a first main surface as a light exiting surface;
a light-cutting scattering layer disposed over the first main surface side of the light guide so as to correspond to the optical axis of each light emitting element;
a light-transmissive sheet disposed over the first main surface side of the light guide; and
a plurality of optical function parts, each disposed in the first main surface of the light guide, each optical function part being a recess in the light guide having a flat surface corresponding to an optical axis of each light emitting element,
wherein the light-cutting scattering layer is positioned to cover each optical function part,
wherein each optical function part has a peripheral portion contacting the light-cutting scattering layer,
wherein the first main surface of the light guide defines a first region having the optical function part formed thereon, and a second region other than the first region,
wherein the light-cutting scattering layer continuously covers the first region, not the second region as seen in a plan view, and
wherein an outline of the light-cutting scattering layer is greater than an outline of the optical function part as seen in the plan view.

2. The light emitting module according to claim 1, wherein a thickness of the light-reflective member is thicker than a thickness of the light emitting element.

3. The light emitting module according to claim 1, wherein a width of the light-cutting scattering layer is wider than a width of the light emitting element.

4. The light emitting module according to claim 1,
wherein the light-reflective member forms an opening to surrounding the light emitting element, and
wherein a width of the light-cutting scattering layer is wider than the opening of the light-reflective member.

5. The light emitting module according to claim 1, wherein the light-cutting scattering layer comprises titanium oxide.

6. The light emitting module according to claim 1, wherein the light guide does not include a phosphor.

7. The light emitting module according to claim 1, wherein the light guide is a light-transmissive member.

8. The light emitting module according to claim 1, further comprising a wiring board positioned on the second surface of the light-reflective member and electrically connected to the pair of electrodes of the light emitting element.

9. The light emitting module according to claim 1, wherein the light-reflective member defines an opening in which the light emitting element is surrounded, the opening having an diameter larger than the outer dimension of the light emitting element such that the light emitting element is spaced apart from an inner surface of the opening.

10. The light emitting module according to claim 1, wherein the light-cutting scattering layer is partially interposed between the light guide and the light-transmissive sheet.

11. The light emitting module according to claim 10, wherein an air gap is formed between the light guide and the light-transmissive sheet, at a position other than a position at which the light-cutting scattering layer is interposed therebetween.

12. A light emitting module comprising:
a plurality of light emitting elements, each having a pair of electrodes, a lateral surface and a light emitting surface;
a plurality of light-reflective members, each having a first surface and a second surface opposite to the first surface, each light-reflective member surrounding the lateral surface of each light emitting element;
a light guide covering the light emitting surface of each light emitting element and the first surface of each light-reflective member, the light guide having a first main surface as a light exiting surface;
a light-cutting scattering layer disposed over the first main surface side of the light guide so as to correspond to the optical axis of each light emitting element;
a light-transmissive sheet disposed over the first main surface side of the light guide, and
a plurality of optical function parts, each disposed in the first main surface of the light guide, each optical function part being a recess in the light guide having a flat surface corresponding to an optical axis of each light emitting element,
wherein the light-reflective member has an inner surface curved at least partially toward the light emitting element,
wherein the light-cutting scattering layer is positioned to cover the optical function part, wherein each optical function part has a peripheral portion contacting the light-cutting scattering layer,
wherein the first main surface of the light guide defines a first region having the optical function part formed thereon, and a second region other than the first region,
wherein the light-cutting scattering layer continuously covers the first region, not the second region as seen in a plan view, and
wherein an outline of the light-cutting scattering layer is greater than an outline of the optical function part as seen in the plan view.

13. A light emitting module comprising:
a light emitting element having a pair of electrodes, a lateral surface and a light emitting surface; a light-reflective member having a first surface and a second surface opposite to the first surface,
the light-reflective member surrounding the lateral surface of the light emitting element;
a light guide covering the light emitting surface of the light emitting element and the first surface of the light-reflective member, the light guide having a first main surface as a light exiting surface and a second main surface opposite to and parallel with the first main surface;
an encapsulating member defining a through hole to surround and contact the lateral surfaces of the light-reflective member and a substantial part of the second main surface of the light guide, the encapsulating member having a first surface covering the second main surface of the light guide and a second surface opposite to and parallel with the first surface,
a light-cutting scattering layer disposed over the first main surface side of the light guide so as to correspond to the optical axis of the light emitting element; and
a light-transmissive sheet disposed over the first main surface side of the light guide,
wherein the encapsulating member is located outer peripheral of the light-reflective member in plan view,
wherein the first surface of the encapsulating member is closer to the light exiting surface than the first surface of the light-reflective member, and
wherein the encapsulating member is spaced apart from the light emitting element.

* * * * *